(12) United States Patent  (10) Patent No.: US 7,608,919 B1
Bernstein et al.  (45) Date of Patent: Oct. 27, 2009

(54) INTERCONNECT PACKAGING SYSTEMS

(75) Inventors: Gary H. Bernstein, Granger, IN (US);
Patrick Fay, Notre Dame, IN (US);
Wolfgang Porod, Granger, IN (US);
Qing Liu, Mishakawa, IN (US)

(73) Assignee: University of Notre Dame Du Lac,
Notre Dame, IN (US)

( * ) Notice: Subject to any disclaimer, the term of this patent is extended or adjusted under 35 U.S.C. 154(b) by 0 days.

(21) Appl. No.: 11/599,257

(22) Filed: Nov. 15, 2006

Related U.S. Application Data

(63) Continuation of application No. 10/933,417, filed on Sep. 3, 2004.

(60) Provisional application No. 60/499,885, filed on Sep. 4, 2003.

(51) Int. Cl.
*H01L 23/02* (2006.01)
*H01L 23/34* (2006.01)
*H01L 23/48* (2006.01)
*H01L 23/52* (2006.01)
*H01L 29/40* (2006.01)

(52) U.S. Cl. .................. 257/685; 257/686; 257/723; 257/777; 257/E23.085; 257/E23.151; 257/E23.152; 257/E23.175; 257/E23.178

(58) Field of Classification Search ............... 257/685, 257/723, 686, 777, E23.085, E23.151, E23.152, 257/E23.175, E23.178
See application file for complete search history.

(56) References Cited

U.S. PATENT DOCUMENTS

| | | | |
|---|---|---|---|
| 3,771,219 A | 11/1973 | Tuzi et al. | |
| 4,868,638 A | 9/1989 | Hirata et al. | |
| 4,990,462 A | 2/1991 | Sliwa, Jr. | |
| 4,996,587 A * | 2/1991 | Hinrichsmeyer et al. | 257/676 |
| 5,071,363 A | 12/1991 | Reylek et al. | |
| 5,140,745 A | 8/1992 | McKenzie, Jr. | |
| 5,198,888 A * | 3/1993 | Sugano et al. | 257/686 |
| 5,250,847 A | 10/1993 | Baskett | |
| 5,281,852 A * | 1/1994 | Normington | 257/685 |
| 5,343,075 A * | 8/1994 | Nishino | 257/686 |
| 5,404,044 A * | 4/1995 | Booth et al. | 257/698 |
| 5,404,265 A * | 4/1995 | Moresco et al. | 361/306.1 |
| 5,482,887 A | 1/1996 | Duinkerken et al. | |

(Continued)

FOREIGN PATENT DOCUMENTS

EP  405865  1/1991

(Continued)

OTHER PUBLICATIONS

Bass, et al., "Beam Lead Quartz Chips for Superconducting Millimeter-Wave Circuits", Proc. SPIE Vol., 4855, Millimeter and Submillimeter Detectors for Astronomy, Thomas G. Phillips, Jonas Zmuidzinas, Editors, Feb. 2003, pp. 415-426.

(Continued)

*Primary Examiner*—Ida M Soward
(74) *Attorney, Agent, or Firm*—Connolly Bove Lodge & Hutz LLP

(57) ABSTRACT

The present invention provides a quilt packaging system for microchip, a method for making such a quilt packaging system, microchips that may be used in a such a quilt packaging system, and methods for making such microchips.

25 Claims, 41 Drawing Sheets

U.S. PATENT DOCUMENTS

| | | | | |
|---|---|---|---|---|
| 5,488,765 | A | 2/1996 | Kubota et al. | |
| 5,493,769 | A | 2/1996 | Sakai et al. | |
| 5,600,101 | A | 2/1997 | Sakai | |
| 5,604,328 | A | 2/1997 | Kubota et al. | |
| 5,625,221 | A * | 4/1997 | Kim et al. | 257/686 |
| 5,625,935 | A | 5/1997 | Kubota et al. | |
| 5,635,669 | A | 6/1997 | Kubota et al. | |
| 5,635,670 | A | 6/1997 | Kubota et al. | |
| 5,656,856 | A * | 8/1997 | Kweon | 257/686 |
| 5,731,222 | A | 3/1998 | Malloy et al. | |
| 5,801,448 | A * | 9/1998 | Ball | 257/778 |
| 5,802,699 | A | 9/1998 | Fjelstad et al. | |
| 5,854,514 | A * | 12/1998 | Roldan et al. | 257/746 |
| 5,877,561 | A | 3/1999 | Kim | |
| 5,904,496 | A | 5/1999 | Richards et al. | |
| 5,912,808 | A | 6/1999 | Ikemoto et al. | |
| 5,953,214 | A | 9/1999 | Dranchak et al. | |
| 5,963,796 | A | 10/1999 | Kim | |
| 6,002,170 | A | 12/1999 | Kim et al. | |
| 6,008,530 | A | 12/1999 | Kano | |
| 6,035,528 | A | 3/2000 | Sasaki et al. | |
| 6,040,235 | A | 3/2000 | Badehi | |
| 6,107,179 | A | 8/2000 | Zomorrodi et al. | |
| 6,110,823 | A | 8/2000 | Eldridge et al. | |
| 6,121,119 | A | 9/2000 | Richards et al. | |
| RE36,916 | E | 10/2000 | Moshayedi | |
| 6,127,274 | A | 10/2000 | Igel et al. | |
| 6,151,220 | A * | 11/2000 | Sakamoto et al. | 361/773 |
| 6,151,775 | A | 11/2000 | Sakai | |
| 6,181,560 | B1 | 1/2001 | Kim | |
| 6,235,551 | B1 | 5/2001 | Farnworth et al. | |
| 6,256,880 | B1 | 7/2001 | Ulmer et al. | |
| 6,268,655 | B1 | 7/2001 | Farnworth et al. | |
| 6,271,597 | B1 * | 8/2001 | Medlen et al. | 257/774 |
| 6,272,745 | B1 | 8/2001 | Kersten et al. | |
| 6,281,588 | B1 * | 8/2001 | Di Stefano et al. | 257/773 |
| 6,287,949 | B1 | 9/2001 | Mori et al. | |
| 6,288,627 | B1 | 9/2001 | Ulmer | |
| 6,316,287 | B1 | 11/2001 | Zandman et al. | |
| 6,320,251 | B1 | 11/2001 | Glenn | |
| 6,351,880 | B1 | 3/2002 | Palmer et al. | |
| 6,369,445 | B1 | 4/2002 | Khoury | |
| 6,379,999 | B1 | 4/2002 | Tanabe | |
| 6,380,619 | B2 | 4/2002 | Ahiko et al. | |
| 6,399,419 | B1 * | 6/2002 | Shibata et al. | 438/108 |
| 6,400,006 | B2 | 6/2002 | Neu et al. | |
| 6,410,406 | B1 | 6/2002 | Farnworth et al. | |
| 6,414,374 | B2 | 7/2002 | Farnworth et al. | |
| 6,441,497 | B1 * | 8/2002 | Han | 257/777 |
| 6,442,044 | B2 * | 8/2002 | Farnworth et al. | 361/796 |
| 6,451,705 | B1 | 9/2002 | Trapp et al. | |
| D466,873 | S | 12/2002 | Kasem et al. | |
| 6,506,664 | B1 | 1/2003 | Beyne et al. | |
| 6,521,970 | B1 | 2/2003 | Takiar et al. | |
| 6,534,726 | B1 | 3/2003 | Okada et al. | |
| D472,528 | S | 4/2003 | Kasem et al. | |
| 6,573,157 | B1 | 6/2003 | Sato | |
| 6,590,282 | B1 * | 7/2003 | Wang et al. | 257/686 |
| 6,635,829 | B2 | 10/2003 | Ulmer et al. | |
| 6,635,960 | B2 | 10/2003 | Farrar | |
| 6,635,962 | B2 * | 10/2003 | Shibata et al. | 257/737 |
| 6,642,137 | B2 | 11/2003 | Yeh et al. | |
| 6,664,129 | B2 | 12/2003 | Siniaguine | |
| 6,680,528 | B2 | 1/2004 | Matsuo et al. | |
| 6,682,953 | B2 | 1/2004 | Sakai et al. | |
| 6,686,654 | B2 | 2/2004 | Farrar et al. | |
| 6,690,088 | B2 * | 2/2004 | MacIntyre | 257/686 |
| 6,691,408 | B2 | 2/2004 | Biron | |
| 6,717,275 | B2 | 4/2004 | Matsuura et al. | |
| 6,727,111 | B2 | 4/2004 | Tsukada | |
| 6,727,116 | B2 | 4/2004 | Poo et al. | |
| 6,735,855 | B2 | 5/2004 | Akram et al. | |
| D492,267 | S | 6/2004 | Kawajiri et al. | |
| 6,751,101 | B2 | 6/2004 | Sakai | |
| 6,760,227 | B2 | 7/2004 | Sakai et al. | |
| 6,768,195 | B2 * | 7/2004 | Drost | 257/723 |
| 6,800,505 | B2 | 10/2004 | Farnworth et al. | |
| 6,808,522 | B2 | 10/2004 | Richards et al. | |
| 6,825,547 | B2 | 11/2004 | Farnworth et al. | |
| 6,828,173 | B2 | 12/2004 | Farnworth et al. | |
| 6,870,270 | B2 * | 3/2005 | Kobrinsky et al. | 257/777 |
| 6,870,271 | B2 * | 3/2005 | Sutherland et al. | 257/777 |
| 6,924,551 | B2 | 8/2005 | Rumer et al. | |
| 6,969,907 | B2 | 11/2005 | Imai et al. | |
| 6,972,243 | B2 | 12/2005 | Patel | |
| 7,030,488 | B2 | 4/2006 | Kiss | |
| 7,086,134 | B2 * | 8/2006 | Dautartas et al. | 29/464 |
| 7,290,321 | B2 * | 11/2007 | Steinberg et al. | 29/464 |
| 2001/0053565 | A1 * | 12/2001 | Khoury | 438/121 |
| 2002/0140084 | A1 | 10/2002 | Kimura | |
| 2002/0183721 | A1 | 12/2002 | Santini et al. | |
| 2003/0012697 | A1 | 1/2003 | Hahn et al. | |
| 2003/0082890 | A1 | 5/2003 | Eldridge et al. | |
| 2004/0178496 | A1 | 9/2004 | Rapport et al. | |
| 2004/0222518 | A1 * | 11/2004 | Haba et al. | 257/734 |
| 2005/0077584 | A1 | 4/2005 | Uhland et al. | |
| 2006/0081976 | A1 | 4/2006 | Patel | |

FOREIGN PATENT DOCUMENTS

JP     2003222633     8/2003

OTHER PUBLICATIONS

S. Kiyono et al., Consideration of Chip Circuit Damages on DCS-FBGA Packages, presented at $52^{nd}$ Electronic Components and Technology Conferences, May 2002, San Diego, CA.

Wu, L., Wang, Y.P., Hsiao C. S., Innovative Stack-Die Package-S2BGA, presented at $52^{nd}$ Electronic Components and Technology Conferences, May 2002, San Diego, CA.

M. Sunohara et al., Development of Wafer Thinning and Double-Sided Bumping, presented at $52^{nd}$ Electronic Components and Technology Conferences, May 2002, San Diego, CA.

Intel Stacked Chip Scale Packaging Products (Nov. 2004), available at hhttp://www.intel.com/design/flcomp/prodbref/298051.htm.

* cited by examiner

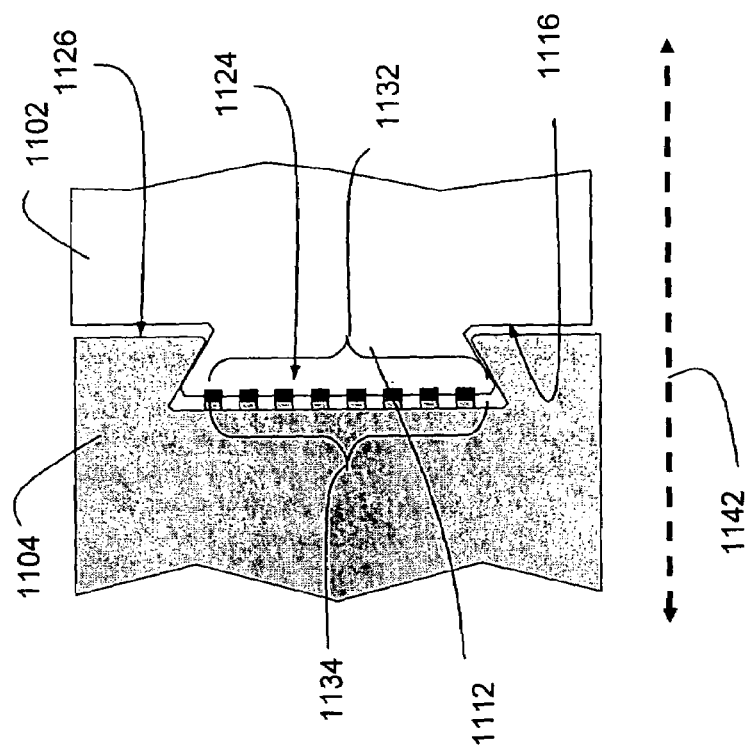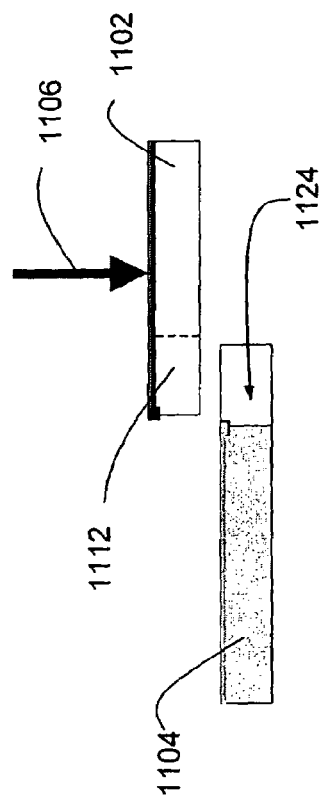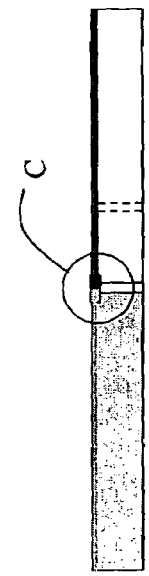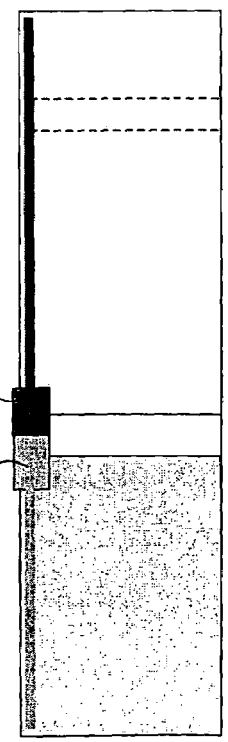

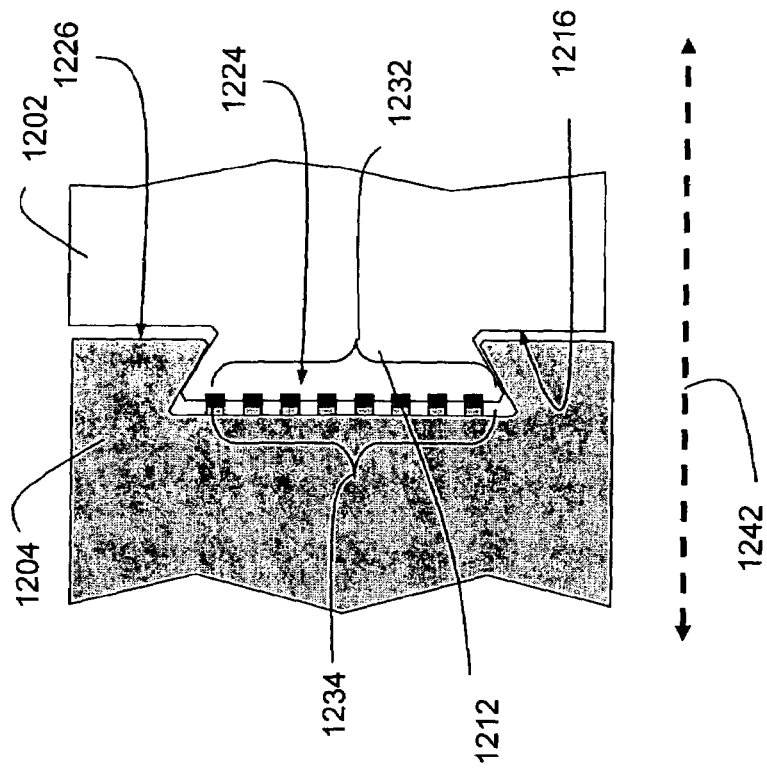
FIG. 12D
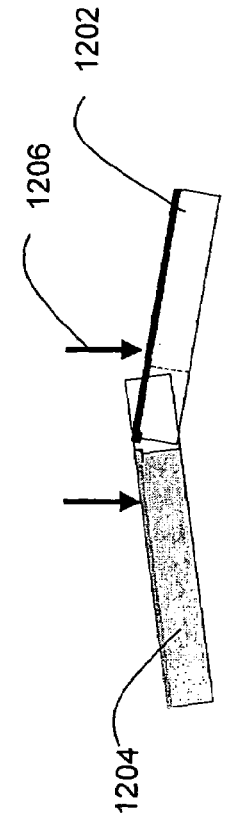
FIG. 12A
FIG. 12B
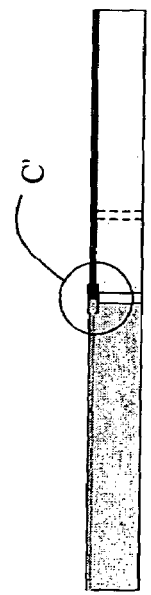
FIG. 12C
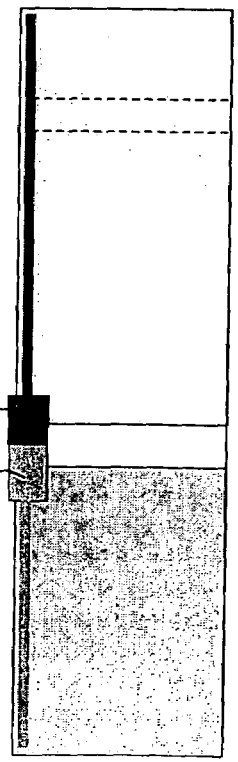

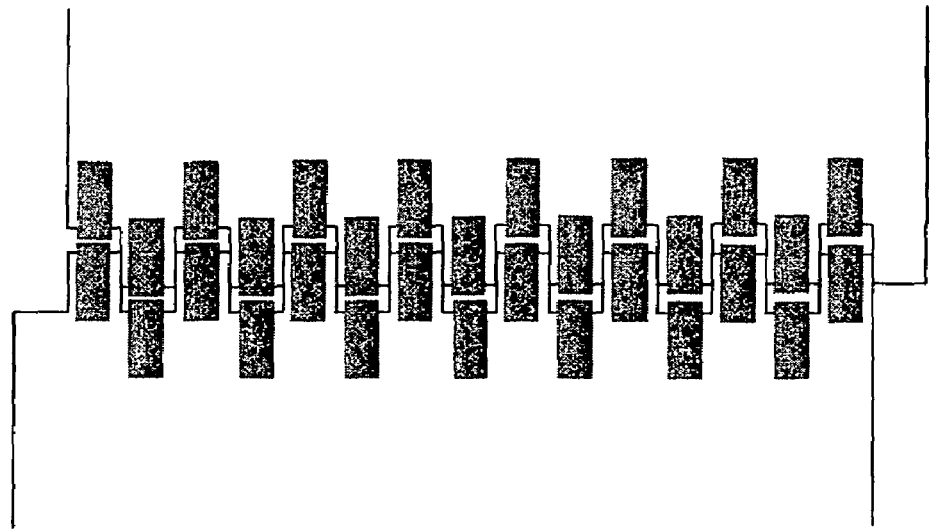
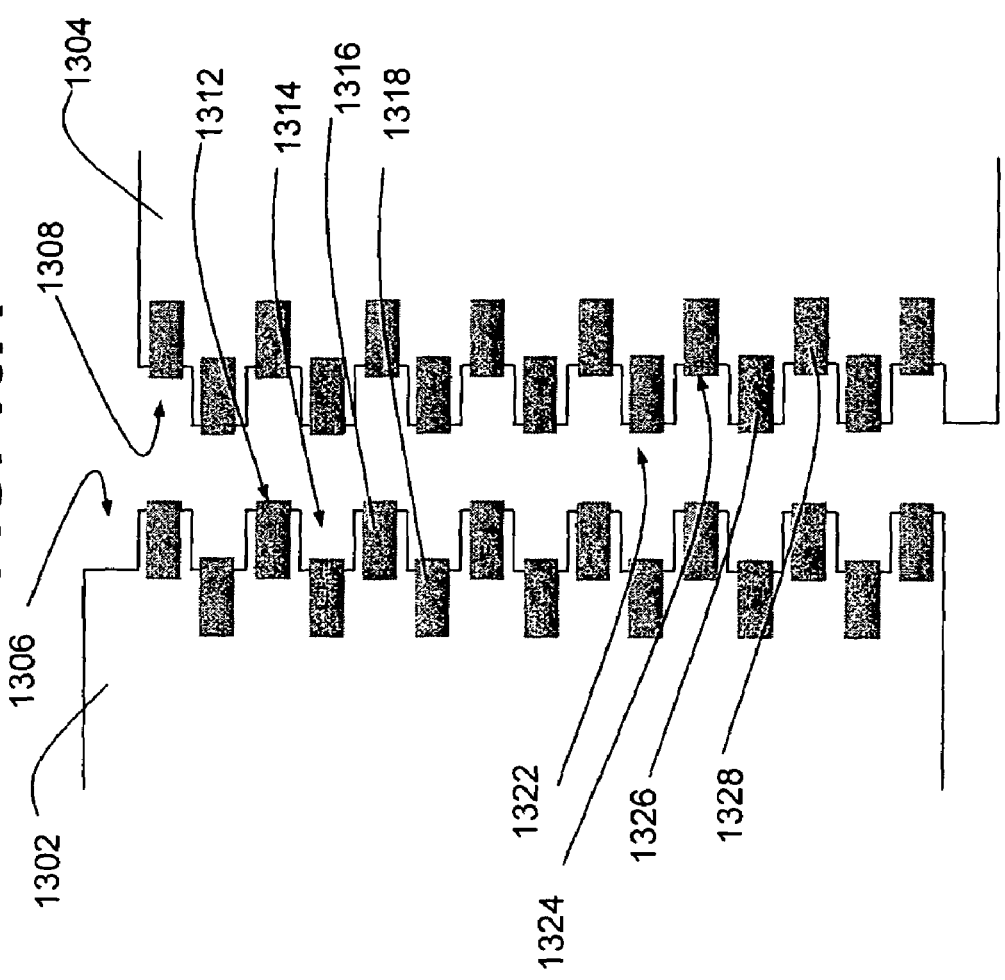

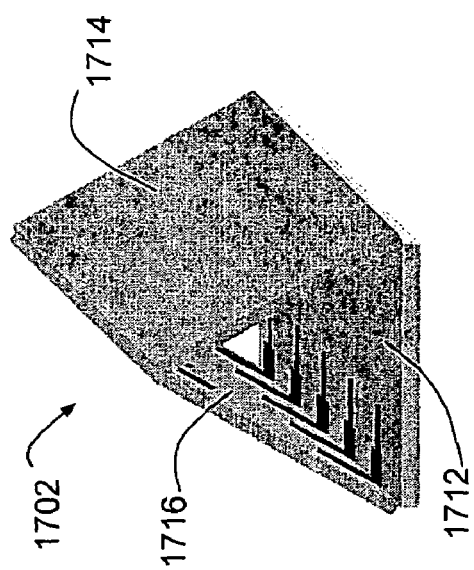
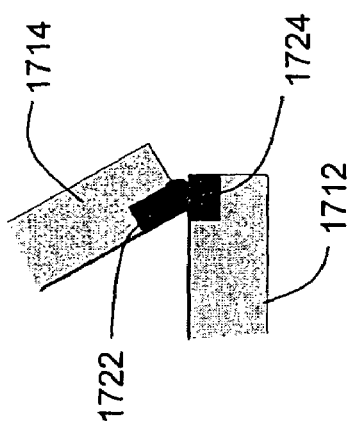
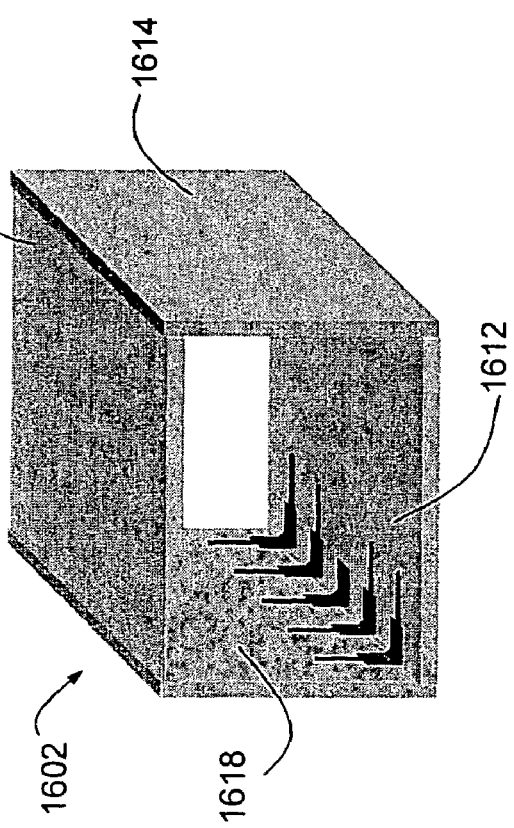
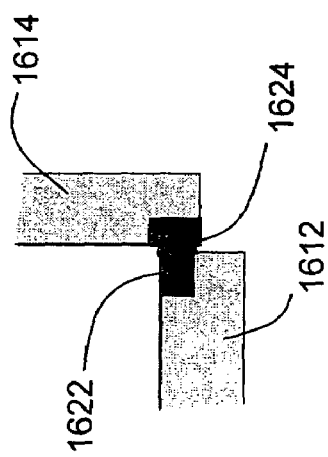

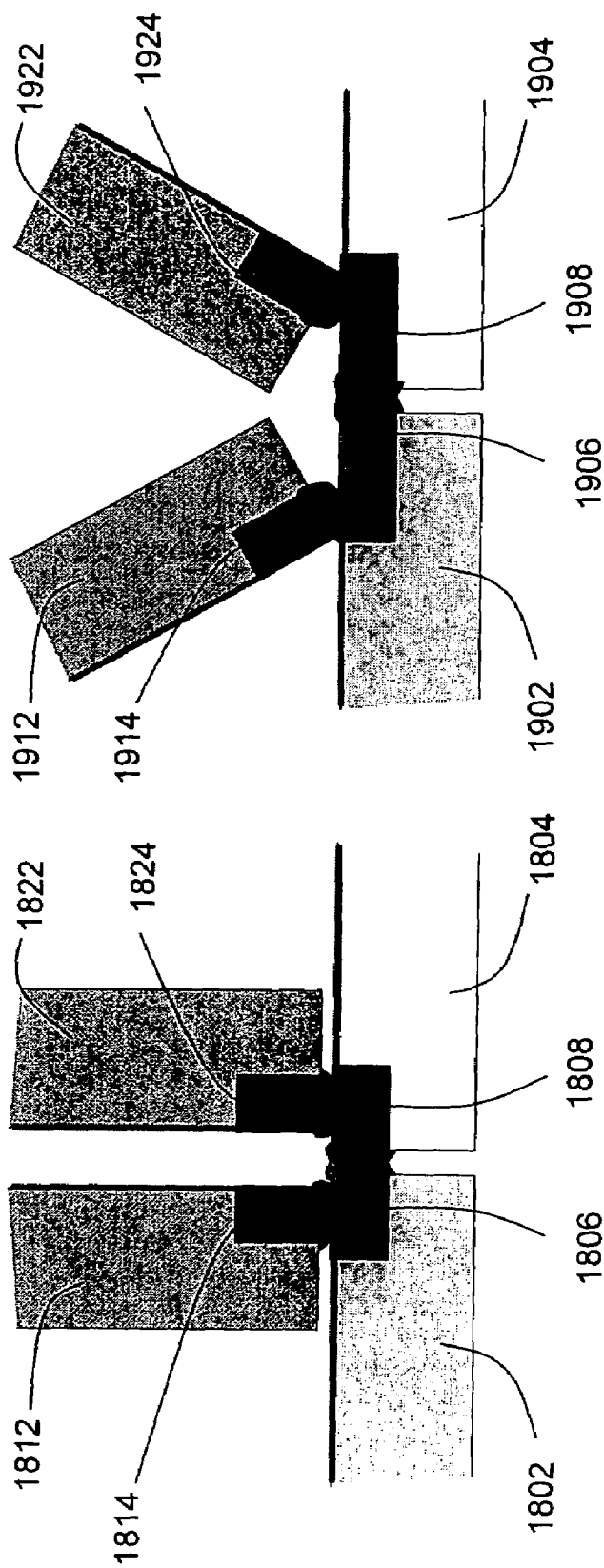

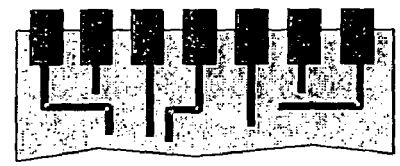
FIG. 22G
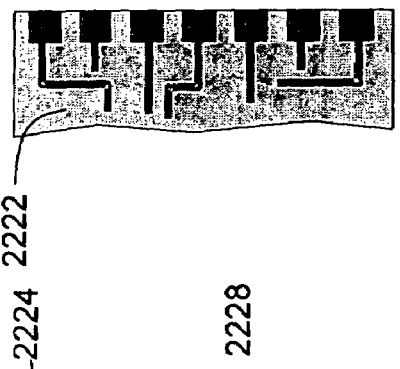
FIG. 22I
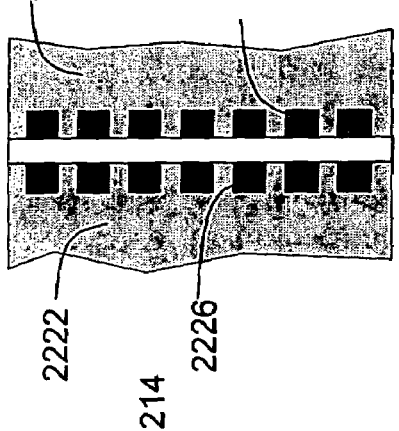
FIG. 22K
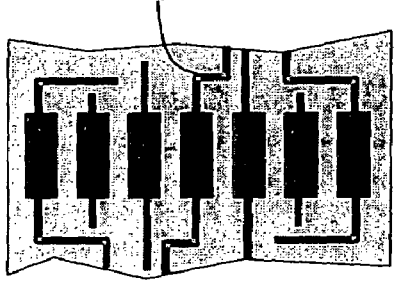
FIG. 22M
FIG. 22H
FIG. 22J
FIG. 22L
FIG. 22N

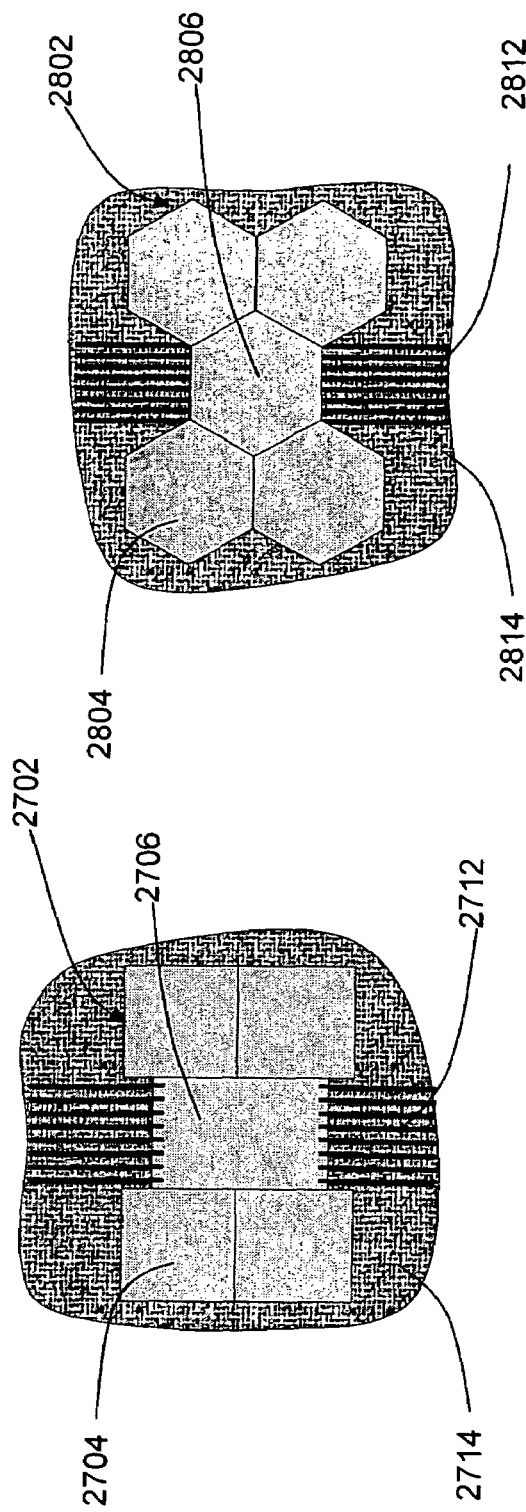
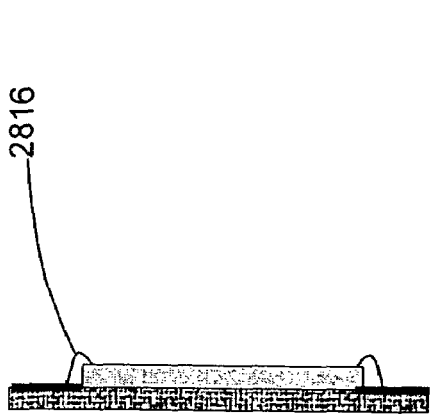
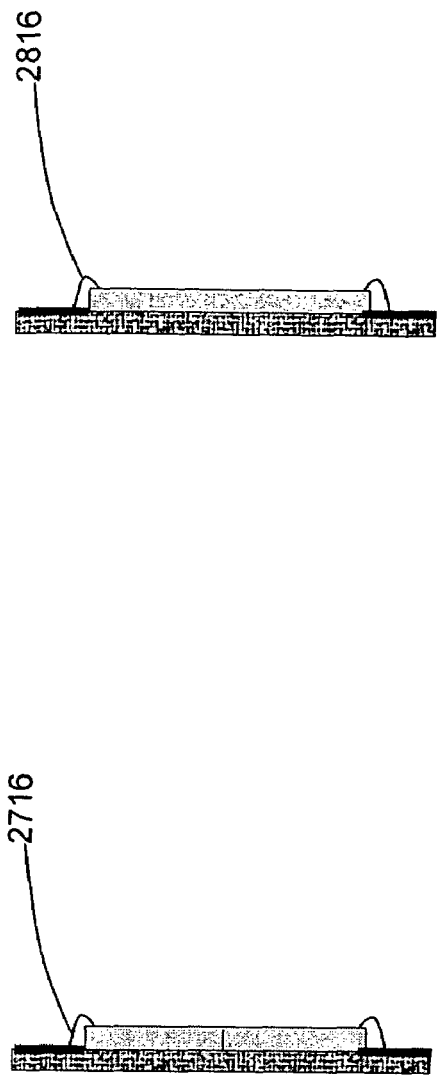

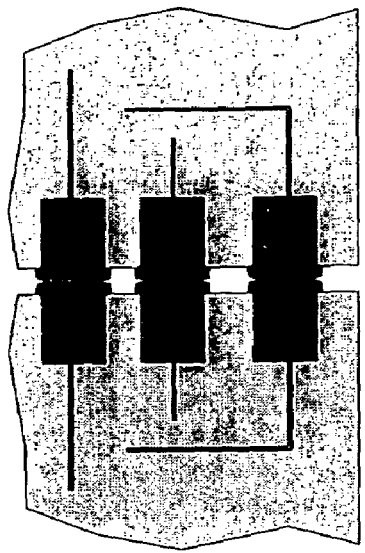
FIG. 29A
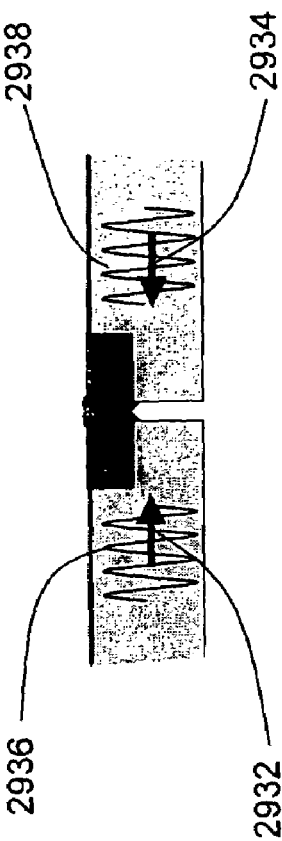
FIG. 29C
FIG. 29D
FIG. 29B

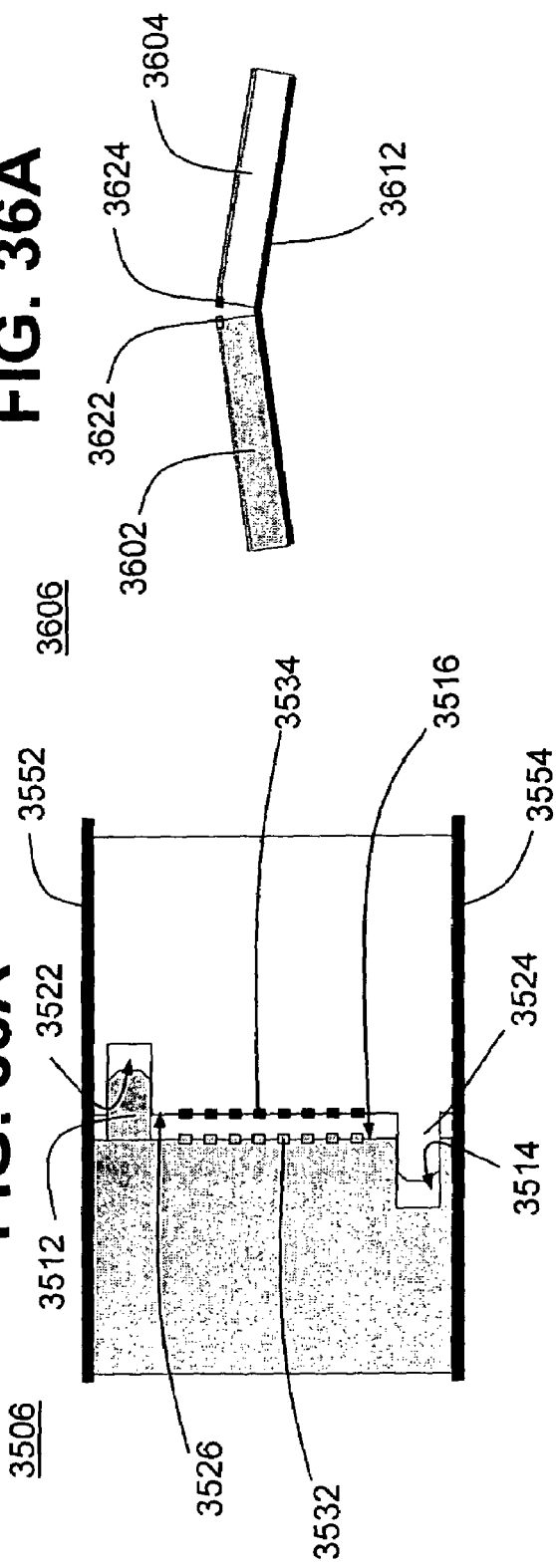
FIG. 35A
FIG. 35B
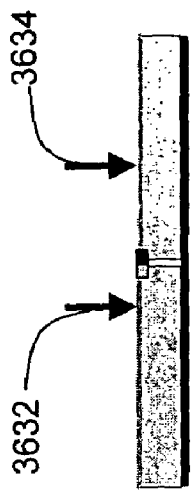
FIG. 36A
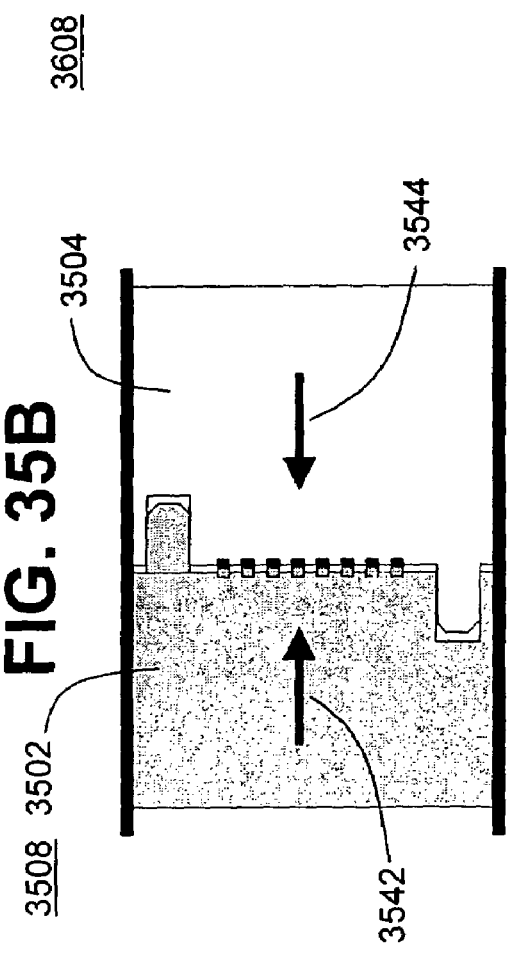
FIG. 36B

INTERCONNECT PACKAGING SYSTEMS

CROSS-REFERENCE TO RELATED APPLICATIONS

This application is a continuation of U.S. patent application Ser. No. 10/933,417, filed on Sep. 3, 2004, entitled, "System for Inter-Chip Communication," which claims priority from U.S. Provisional Patent Application. No. 60/499,885, entitled "Integration of Heterogeneous Communications Systems-in-Package," filed Sep. 4, 2003. The above applications are hereby incorporated by reference herein.

BACKGROUND

1. Field of the Invention

The present invention relates generally to microchips and systems and devices employing microchips.

2. Related Art

There is currently a need in high-performance integrated systems for new approaches to device and circuit packaging that meet the extremely stringent performance demands of such systems in terms of signal integrity, bandwidth, and latency. Simultaneously, there is a need to meet such demands, while keeping the cost of such integrated systems low by making such systems easy to manufacture.

Also, a problem with current high-performance integrated systems is that they require increasing amounts of power and waste considerable energy in the form of heat.

SUMMARY

It is one object of the present invention to provide an integrated system that provides reduced power dissipation through elimination of pin drivers and package capacitances.

It is one object of the present invention to provide a high performance integrated system that provides good signal integrity.

It is another object of the present invention to provide a high performance integrated system that provides high bandwidth.

It is yet another object of the present invention to provide a high performance integrated system that provides low latency.

It is yet another object of the present invention to provide a high performance integrated system that is easy to manufacture.

It is yet another object of the present invention to provide a high performance integrated system that results in cost reductions by allowing increased functionality within a single package.

It is yet another object of the present invention to provide a high performance integrated system that allows for heterogeneous integration of ICs and components fabricated using different processes (e.g. bipolar and CMOS) and material systems (e.g. Si and III-V semiconductors).

It is yet another object of the present invention to provide a high performance integrated system that provides a functional partition, allowing complex designs to be broken into functional sub-blocks.

It is yet another object of the present invention to provide a high performance integrated system that allows increased usable wafer area and die-on-wafer silicon efficiency by elimination of saw streets and bond pads.

It is yet another object of the present invention to provide a high performance integrated system that provides circuit simplification and area reduction through elimination of ESD protection circuits and high-power pin drivers.

According to a first broad aspect of the present invention, there is provided a microchip device comprising: a first microchip having one or more first interconnect nodules for making a conductive electrical connection with one or more electrical contacts of one or more electronic devices, wherein the one or more first interconnect nodules are disposed on one or more edges of the first microchip.

According to a second broad aspect of the invention, there is provided a non-rectangular shaped microchip.

According to a third broad aspect of the invention, there is provided a packaging system for microchips comprising: a quilt packaging system comprising: a plurality of microchips including one or more conductive electrical connections between one or more first interconnect nodules disposed on one or more edges of a first microchip of the plurality of microchips and one or more second interconnect nodules disposed on one or more edges of a second microchip of the plurality of microchips.

According to a fourth broad aspect of the invention, there is provided a method of making a microchip comprising the following steps: (a) forming interconnect nodules on a semiconductor wafer, the interconnect nodules being in communication with one or more dies-on-wafer on the semiconductor wafer; and (b) separating the one or more dies-on-wafer from the semiconductor wafer to form one or more microchips having the interconnect nodules on one or more edges thereof.

According to a fifth broad aspect of the invention, there is provided a method of making a packaging system for microchips comprising the follow steps: (a) providing a first microchip including one or more first interconnect nodules disposed on an edge thereof; (b) providing a second microchip including one or more second interconnect nodules disposed on an edge thereof; (c) electrically connecting the first microchip to the second microchip by making one or more conductive electrical connections between the first interconnect nodule and the second interconnect nodule.

BRIEF DESCRIPTION OF THE DRAWINGS

The invention will be described in conjunction with the accompanying drawings, in which:

FIG. 11A is a schematic cross-sectional partial side view of two microchips of the present invention being slid into engagement with each other;

FIG. 11B is a schematic cross-sectional partial side view of the two microchips of FIG. 11A, wherein the two microchips are aligned and the interconnect nodules of the two chips are in electrical communication with each other;

FIG. 11C is an enlarged cross-sectional partial side view of region C of FIG. 11B;

FIG. 11D is a schematic partial top view of the aligned microchips of FIGS. 11B and 11C;

FIG. 12A is a schematic cross-sectional partial side view of two microchips of the present invention being engaged with each other;

FIG. 12B is a schematic cross-sectional partial side view of the two microchips of FIG. 12A, wherein the two microchips are aligned and the interconnect nodules of the two chips are in electrical communication with each other;

FIG. 12C is an enlarged cross-sectional partial side view of region C' of FIG. 12B;

FIG. 12D is a schematic partial top view of the aligned microchips of FIGS. 12B and 12C;

FIG. 13A is a schematic partial top view of two microchips having mating modulated edges in accordance with one embodiment of the present invention;

FIG. 13B is a schematic partial top view of the two microchips of FIG. 13A electrically mated to each other and with their respective interconnect nodules in electrical communication with each other;

FIG. 16A is a schematic computer graphic view of a 3-dimensional quilt packaging system in accordance with one embodiment of the present invention having a rectangular shape;

FIG. 16B is a schematic cross-sectional partial side view of an exemplary electrical connection between two microchips of the quilt packaging system of FIG. 16A;

FIG. 17A is a schematic computer graphic view of a 3-dimensional quilt packaging system in accordance with one embodiment of the present invention having a triangular shape;

FIG. 17B is a schematic cross-sectional partial side view of an exemplary electrical connection between two microchips of the quilt packaging system of FIG. 17A;

FIG. 18 is a schematic cross-sectional partial side view of a quilt packaging system having a branched configuration in accordance with one embodiment of the present invention;

FIG. 19 is a schematic cross-sectional partial side view of a quilt packaging system having a branched configuration in accordance with one embodiment of the present invention;

FIG. 22G is a schematic partial top view of the wafer of FIG. 22E having circuitry deposited thereon;

FIG. 22H is a schematic cross-sectional partial side view of the wafer of FIG. 22G;

FIG. 22I is a schematic partial top view of the semiconductor wafer of FIG. 22E being partially separated into two microchips in accordance with one embodiment of the present invention;

FIG. 22J is a schematic cross-sectional partial side view of the two microchips of FIG. 22I;

FIG. 22K is a schematic partial top view of one of the two microchips of FIG. 22I;

FIG. 22L is a schematic cross-sectional partial side view of the microchips of FIG. 22K with a punch in the process of flattening conductive material of the microchip;

FIG. 22M is a schematic partial top view of the semiconductor wafer of the microchip of FIG. 22K including protruding interconnect nodules;

FIG. 22N is a schematic cross-sectional partial side view of the microchip of FIG. 22M and the punch flattening the conductive material of an interconnect nodule to make the interconnect nodule protrude;

FIG. 27A is a schematic partial top view of a quilt packaging system in accordance with one embodiment of the present invention that is electrically connected to a PCB by wire bonds;

FIG. 27B is a schematic cross-sectional partial side view of the quilt packaging system and PCB of FIG. 27A;

FIG. 28A is a schematic partial top view of a quilt packaging system in accordance with one embodiment of the present invention that is electrically connected to a PCB by wire bonds;

FIG. 28B is a schematic cross-sectional partial side view of the quilt packaging system and PCB of FIG. 28A;

FIG. 29A is a schematic partial top view of two microchips of the present invention having interconnect nodules with spheroid-shaped ends;

FIG. 29B is a schematic partial cross-sectional side view of the two microchips of FIG. 29A;

FIG. 29C is a schematic partial top view of two microchips FIG. 29A being bonded together;

FIG. 29D is a schematic partial cross-sectional side view of the two microchips of FIG. 29C;

FIG. 35A is a schematic partial top view of a dynamic sliding on-off quilt packaging system in an off-position in accordance with one embodiment of the present invention;

FIG. 35B is a schematic partial top view of the dynamic sliding on-off quilt packaging system of FIG. 35A in an on-position;

FIG. 36A is a schematic partial cross-sectional side view of a dynamic flexible on-off quilt packaging system in an off-position in accordance with one embodiment of the present invention;

FIG. 36B is a schematic partial cross-sectional side view of the dynamic flexible on-off quilt packaging system of FIG. 36A in an on-position;

DETAILED DESCRIPTION

Figure 1:
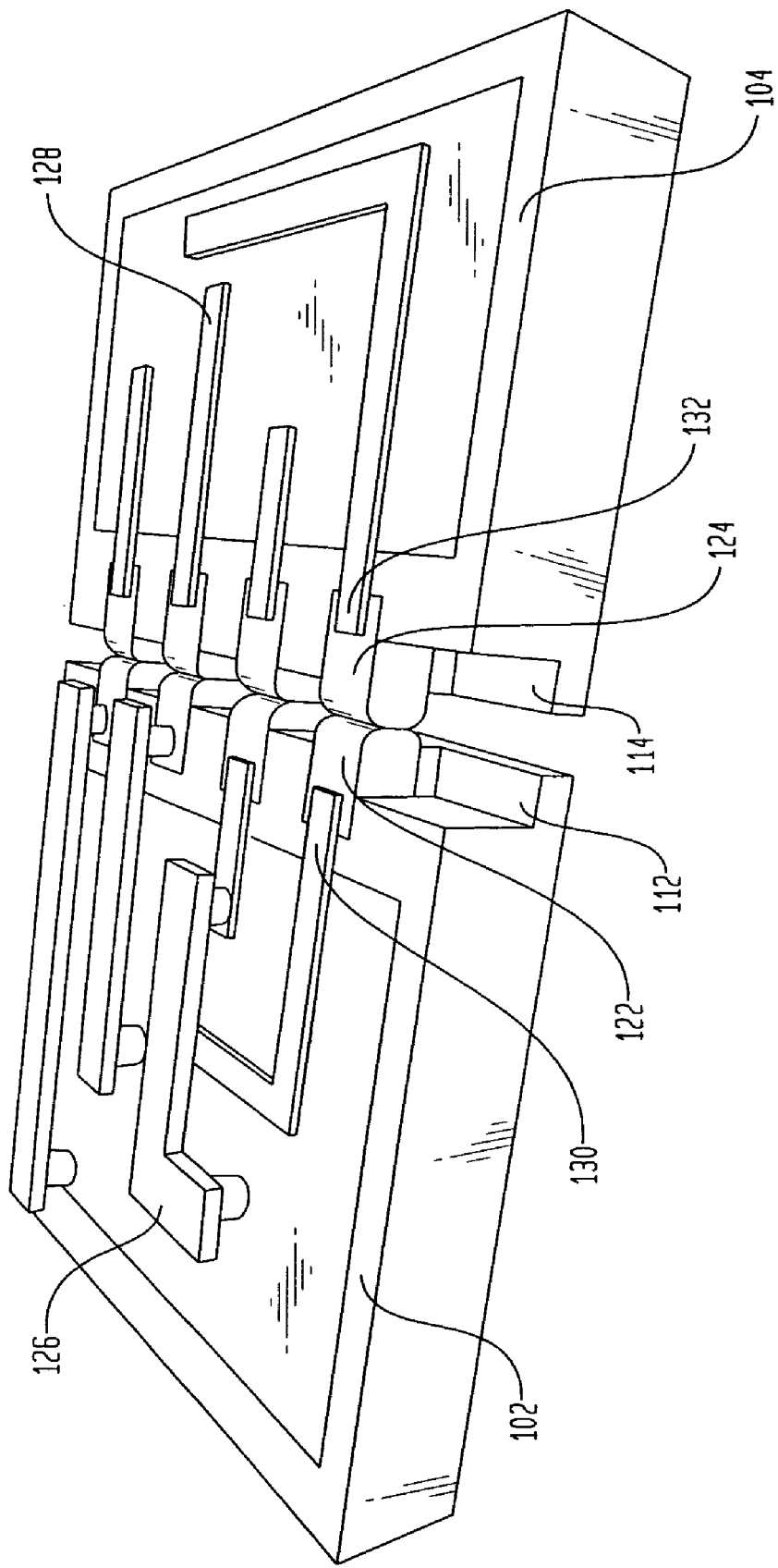
FIG. 1 is a three-dimensional computer generated image in simplified form of two microchips of the present invention that include edge interconnections.

It is advantageous to define several terms before describing the invention. It should be appreciated that the following definitions are used throughout this application.

DEFINITIONS

Where the definition of terms departs from the commonly used meaning of the term, applicant intends to utilize the definitions provided below, unless specifically indicated.

For the purposes of the present invention, the term "convex" refers to a microchip having the shape of a convex closed curve. Examples of convex shapes are: circles, triangles, squares, rectangles, parallelograms, rhombi, hexagons, octagons, etc.

For the purposes of the present invention, the term "die-on-wafer" refers to an integrated circuit that has been formed on a silicon wafer and is not yet separated from the wafer.

For the purposes of the present invention, the term "direct electrical connection" refers to the direct contact between interconnect nodules or between an interconnect nodule and an electrical contact so that electrical conduction current may pass between them.

For the purposes of the present invention, the term "electronic device" refers to electronic circuitry and any device that includes electronic circuitry. Examples of electronic devices include microchips, package systems, transistors, PCBs, amplifiers, sensors, inductors, capacitors, electrical connectors into which microchips may be plugged, etc.

For the purposes of the present invention, the term "interposer" refers to any structure whose purpose is to extend or complete a conductive electrical connection between two electronic devices. In some embodiments of the present invention, the conductive electrical connection between interconnect nodules or between an interconnect nodule and a contact may not be direct. For example, in some embodiments of the present invention, a conductive material, such as solder, may electrically connect two interconnect nodules or an interconnect nodule with an electrical contact. Also, in some embodiments, connectors of various types may help conductively electrically connect interconnect nodules.

For the purposes of the present invention, the term "microchip" refers to any kind of chip having microfabricated or nanofabricated systems built thereon. Microchips include not only conventional integrated circuits, but also, MEMS (Microelectromechanical Systems) chips.

For the purposes of the present invention, the term "non-convex" refers to a microchip having the shape of a non-convex closed curve.

For the purposes of the present invention, the term "single chip device" refers to any device that has been made as a single chip. The quilt packaging system of the present invention allows for a single chip device to be made as a multi-chip quilt packaging system device. Examples of single chip devices include but are not limited to the following: CPUs, microprocessors, graphics processors, memory chips, MEMS, etc.

DESCRIPTION

Advanced system-in-package (SiP) designs require substantial innovation in packaging and interconnect technology in order to achieve their ultimate promise for delivering affordable, high functionality, compact devices. Future systems will require combinations of radio frequency (RF), optoelectronics, high-speed logic, memory, and MEMS-enabled functionality, all combined into a single, compact, light-weight and low-power SiP. A fundamental consideration in implementing a SiP design of this sort is how to accomplish heterogeneous integration of the various system components, without incurring unacceptable penalties in terms of either performance or cost. The ability to integrate circuits and components fabricated using disparate and incompatible fabrication processes (e.g. CMOS and bipolar) and materials (Si, III-V semiconductors) is critical for providing the means to realize, in a single package, higher levels of functionality than are presently possible.

In one embodiment the quilt packaging system of the present invention uses the vertical facets on edges of a microchip to make direct electrical contact between integrated circuits. Metal or otherwise conductive nodules are revealed on the vertical surfaces of each microchip, and multiple microchips are welded together in a pattern reminiscent of a quilt to form high-performance electrical connections between the microchips. In this way, the delays and other constraints due to chip-to-package and package-to-chip data transfers are avoided.

In one embodiment of the present invention, the quilt packaging system of the present invention allows for chips to be directly interconnected without the need to go through first-level packaging to printed circuit boards (PCBs) or multichip modules (MCMs). The quilt packaging system of the present invention forms contacts along the vertical edge facets of integrated circuits, enabling ICs or other types of microchips to be interconnected by placing them side-by-side. This technology may have a dramatic impact on the way portable and high-performance electronic systems are designed, particularly for complex or cost-sensitive applications. Possible applications include optical spectroscopy for on-chip chemical analysis, high-speed optical networking, RF communication systems, and advanced mixed-signal electronics. Although various processes may be used to form the quilt packaging system of the present invention, one process that may be used involves using deep reactive ion etching (DRIE) and metal plating, which together may be used to form solid metallic contacts along the vertical edge facets of one or more microchips. The planar geometry of the edge interconnects promises ultra-high signal bandwidths and excellent signal integrity characteristics, while simultaneously achieving high pitch density.

The quilt packaging system of the present invention provides an ultrafast, high density, inexpensive SiP packaging that embraces heterogeneous device technologies. Its potential impact can hardly be overstated. The limitations of silicon technology, as described by the ITRS (International Technology Roadmap for Semiconductors), would be nearly side-stepped in the proposed SiP approach. Using the quilt packaging system the emphasis on ICs following Moore's law may shift from increasing transistor density and complexity to the systems level (i.e. increasing system-level complexity, with only modestly increasing die complexity).

The quilt packaging system of the present invention provides a new concept in high-speed, high-density, heterogeneous integration. Also, RF systems using quilt packaging provide benefits in cost and performance as compared to current ways of mounting microchips. In addition, as described below and shown in the drawings, the present invention provides a process scheme for achieving chip features suitable for quilt packaging.

The present invention also provides the ability to integrate circuits and components fabricated using disparate and incompatible fabrication processes and materials and offers the opportunity to realize, in a single package, higher levels of functionality than are presently possible. This approach provides solutions to realizing compact systems for advanced remote sensing, bio-chemical agent detection, electronic communications, and high-performance networking applications where heterogeneous integration of sensors, optoelectronic devices, and high-performance electronics are required.

The present invention provides a technique for interconnecting directly between adjacent chips without the need to go through first-level packaging to PCBs or MCMs. This approach facilitates integration of, within a single package, silicon and III-V, II-VI or IV-IV semiconductor ICs while simultaneously improving the bandwidth and signal integrity of the interconnections between these devices and circuits. Thus, the packaging approach of the present invention is a natural means to achieve true SiP and system-on-chip (SoC) implementations.

The quilt packaging system of the present invention has applications in a number of advanced RF and communications applications requiring either high electrical interconnect performance or the integration of optoelectronic, electronic, and sensory components in a single package. Applications include ultracompact RF communications equipment, high-speed optical networking, advanced mixed-signal electronics, as well as bio-chemical agent detection and remote sensing.

In addition to the benefits already described, the quilt packaging system of the present invention may provide: enhanced heat dissipation through support chips, system cost reduction by allowing increased functionality within a single package, heterogeneous integration of ICs and components fabricated using different processes (e.g. bipolar and CMOS) and material systems (e.g. Si and III-V semiconductors), functional partitioning of ICs allowing complex designs to be broken into functional sub-block ICs and integrated into a full system in a single package, increased usable wafer area and silicon efficiency by elimination of saw streets and bond pads, decreased weight and volume of chip and board structures, circuit simplification and area reduction through elimination of ESD protection circuits and high-power pin drivers.

Because the microchips and other electrical components in the quilt packaging system are conductively connected over much reduced distances compared with conventional interconnect technologies, for example PCBs, the capacitance of the interconnects that run between the electrical systems is significantly reduced, and the pad drivers and their associated power dissipation can be eliminated. Significant reductions in overall circuit power dissipation result.

The quilt packaging system may be used by itself or in combination with existing bonding techniques for microchips and electronic devices.

In one embodiment, the quilt packaging system of the present invention employs DRIE and plating to form metal-filled deep trenches at the edges of a die-on-wafer to provide an additional means of interconnection besides bonding pads/wires. The various die-on-wafer in the system are interconnected either wholly or partly by butting them edgewise against each other, as depicted in the embodiment of the present invention shown in FIG. 1. Conventional wirebonds may still be used to provide interconnections to next-level packaging and conventional pin arrays and lead frames.

FIG. 1 is a simplified representation of two IC chips 102 and 104 of the present invention including edge interconnections. For clarity, the scales have been exaggerated in FIG. 1. Notches 112 and 114 at respective front edges of chips 102 and 104 are cutaways to show the details of respective interconnect regions 122 and 124. Chips 102 and 104 also include several layers of circuitry 126 and 128 that include terminal ends 130 and 132 at interconnect regions 122 and 124.

Although for simplicity, there are only 4 interconnect regions shown for each chip in FIG. 1, in actual chips there may be many more than 4 interconnect regions. Also, although in FIG. 1 it appears that only one layer of circuitry has terminal ends in the interconnect regions, the chips of the present invention may have terminal ends in more than one circuitry layer of the chip. In FIG. 1 and in all of the drawings described below, unless otherwise specified, there are several layers of circuitry in each of the IC chips that is represented by one or two layers of "simplified circuitry" for convenience of illustration.

The protruding edge interconnection nodules may be formed by DRIE of trenches and grooves, followed by plating to fill the grooves and form the nodules. The trenches will be designed for easy die separation leaving metallized nodules on the edges of the wafer. Assuming a die edge of 10 mm and a nodule pitch of 20 µm, two thousand such nodules could be fabricated along the periphery. Larger chips and finer pitch may allow yet more nodules to be disposed along the periphery. Nodules may be plated up to extend beyond the edge of the die-on-wafer so that physical contact between adjacent die on any conventional package support substrate may be achieved.

Figure 2A:
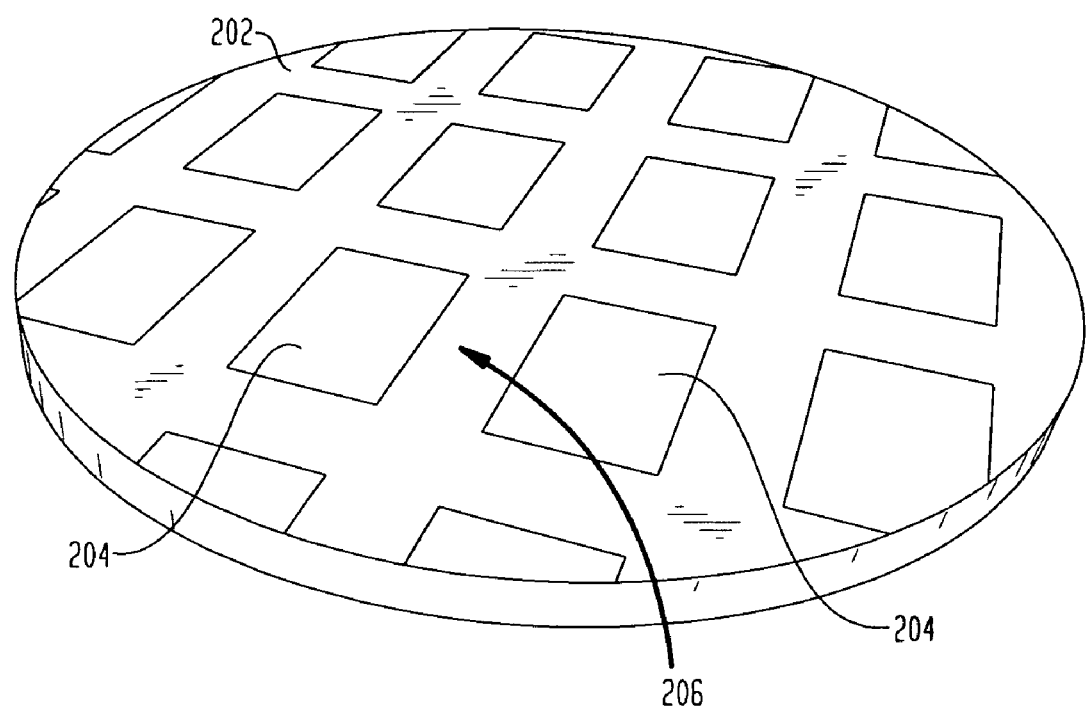
FIGS. 2A, 2B, 2C, 2D, 2E, 2F, 2G, 2H, and 2I are perspective view computer graphic images illustrating one process for forming microchips with interconnect nodules in accordance with one embodiment of the present invention.
Figure 2B:
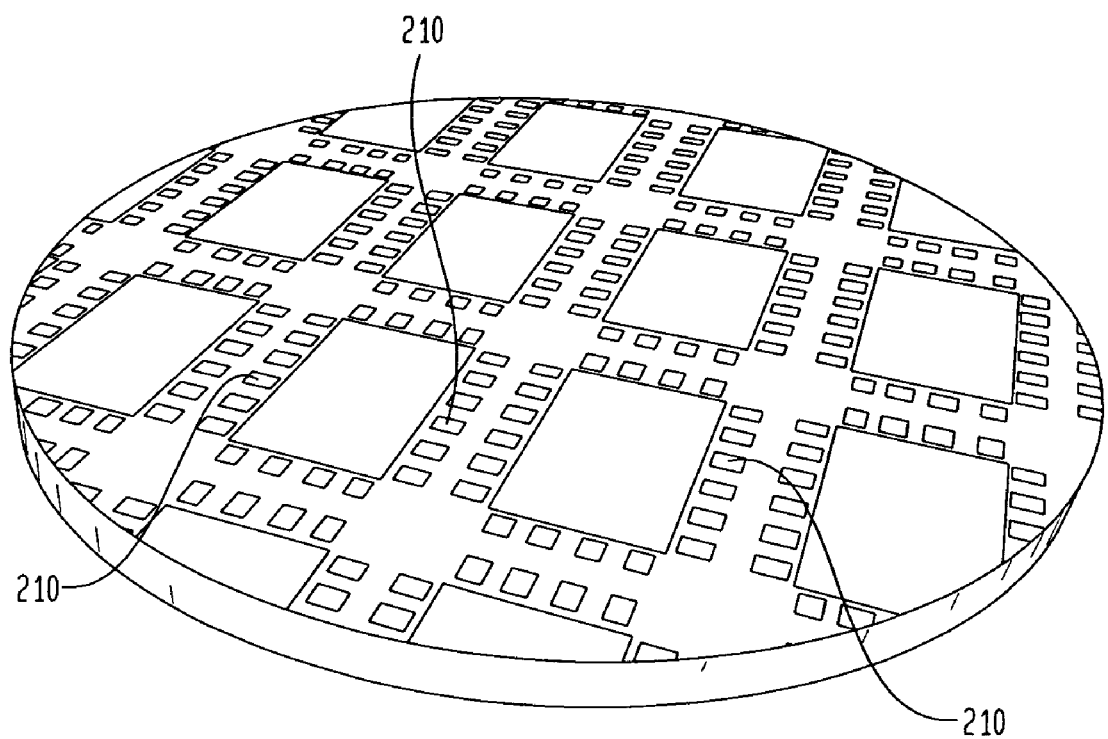
Figure 2C:
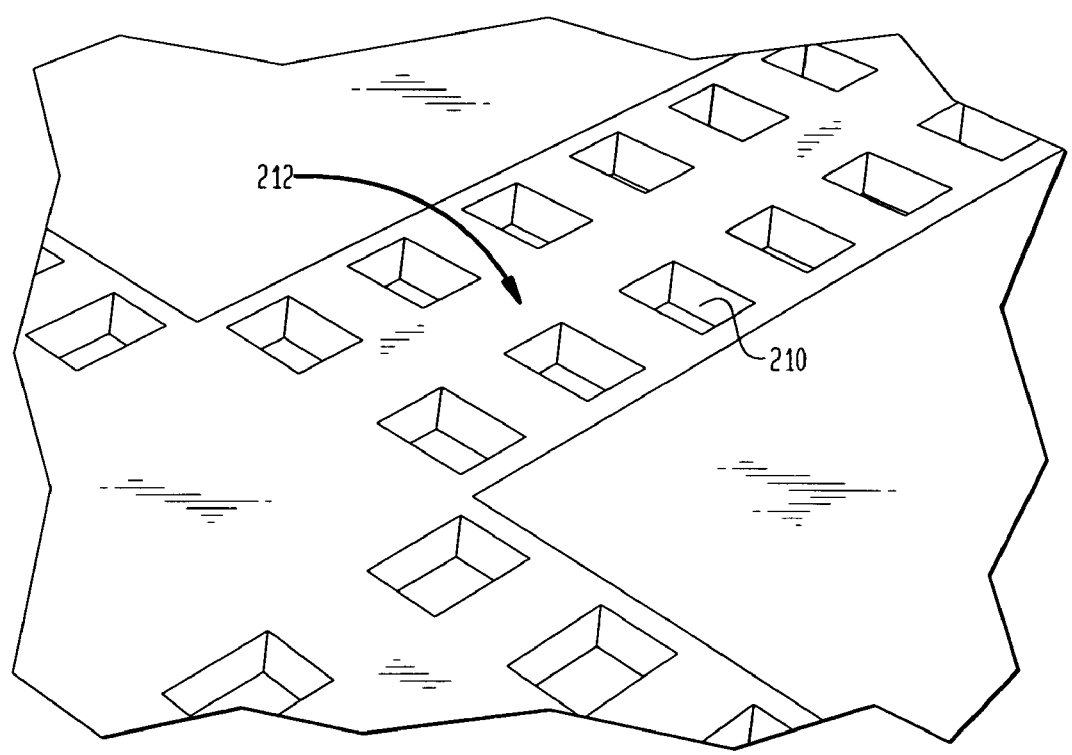
Figure 2D:
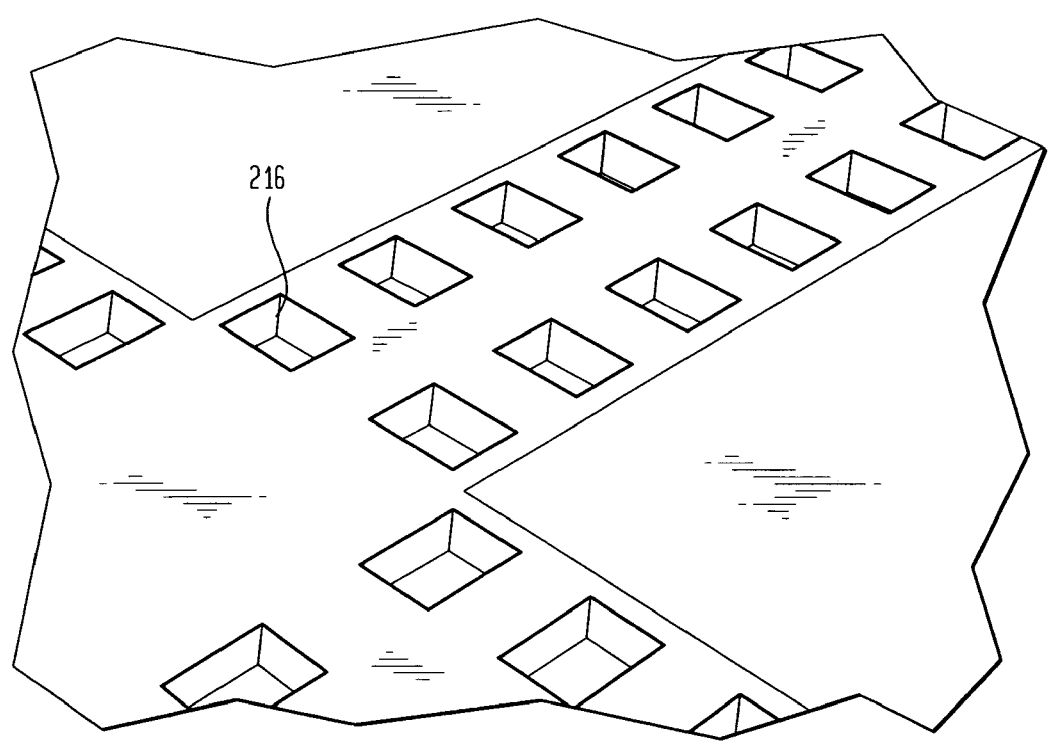
Figure 2E:
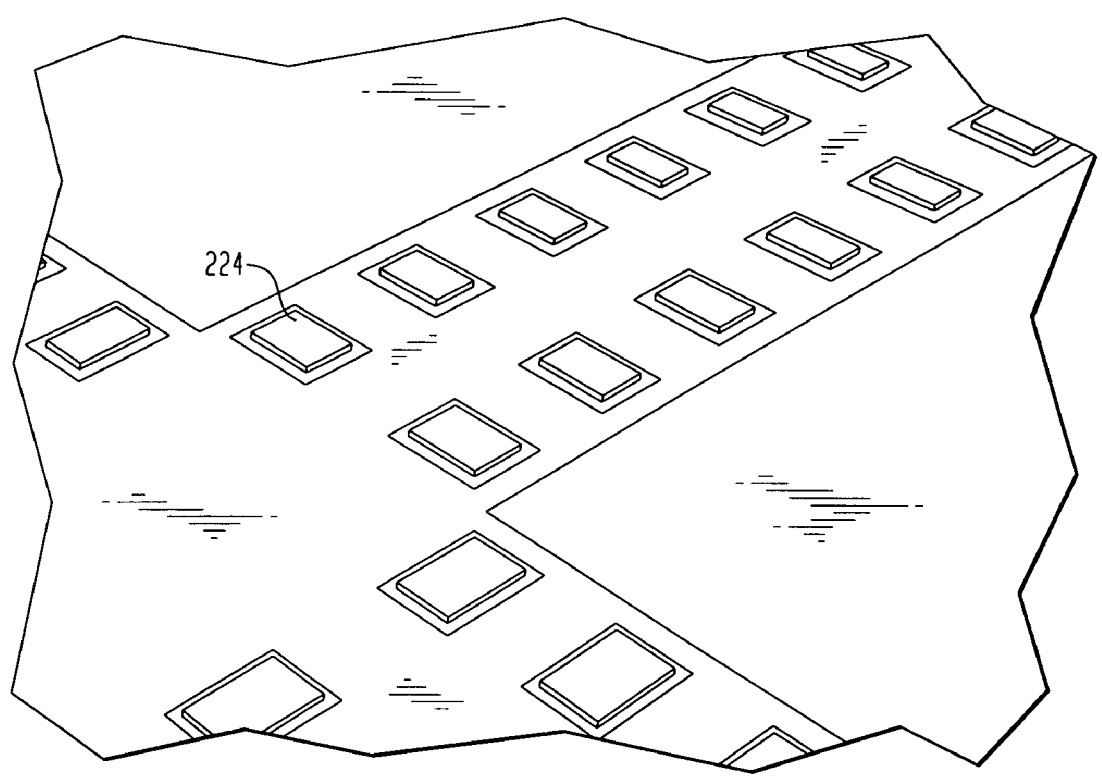
Figure 2F:
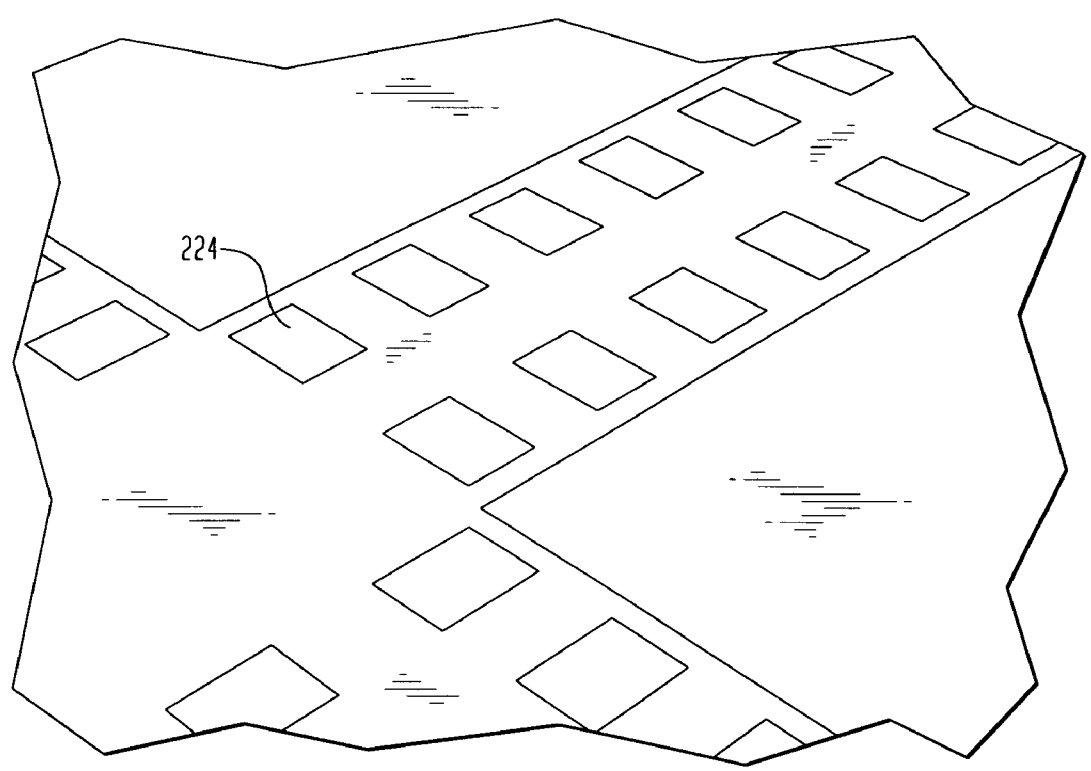
Figure 2G:
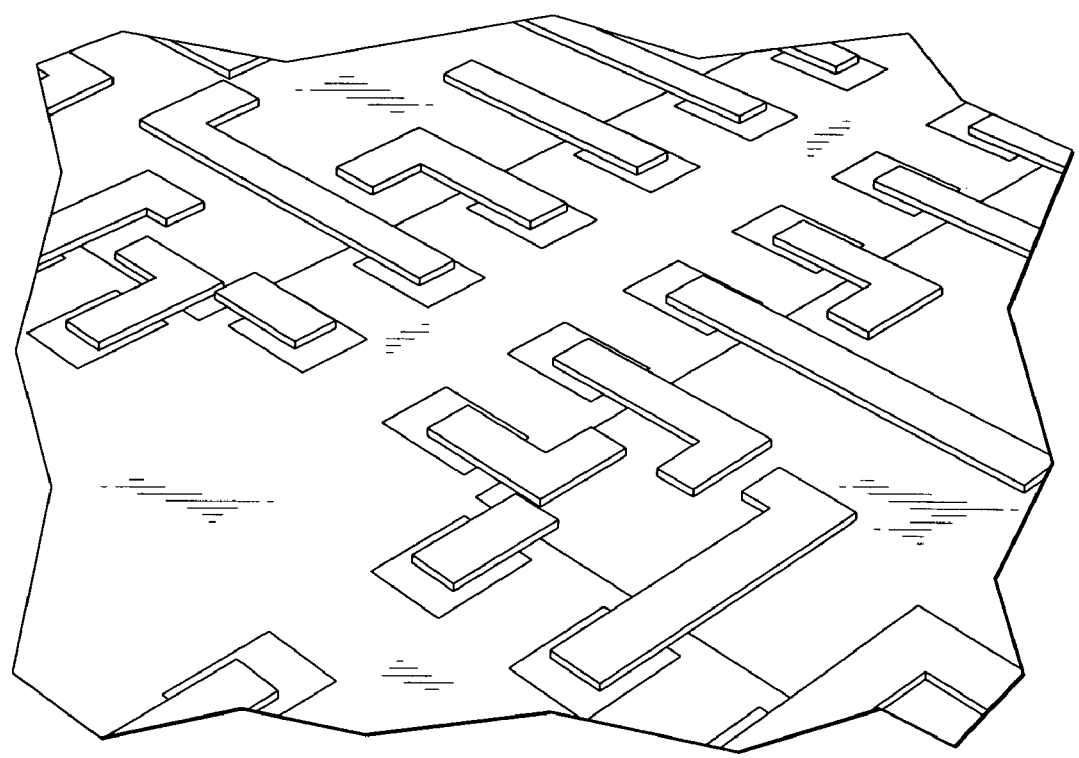
Figure 2H:
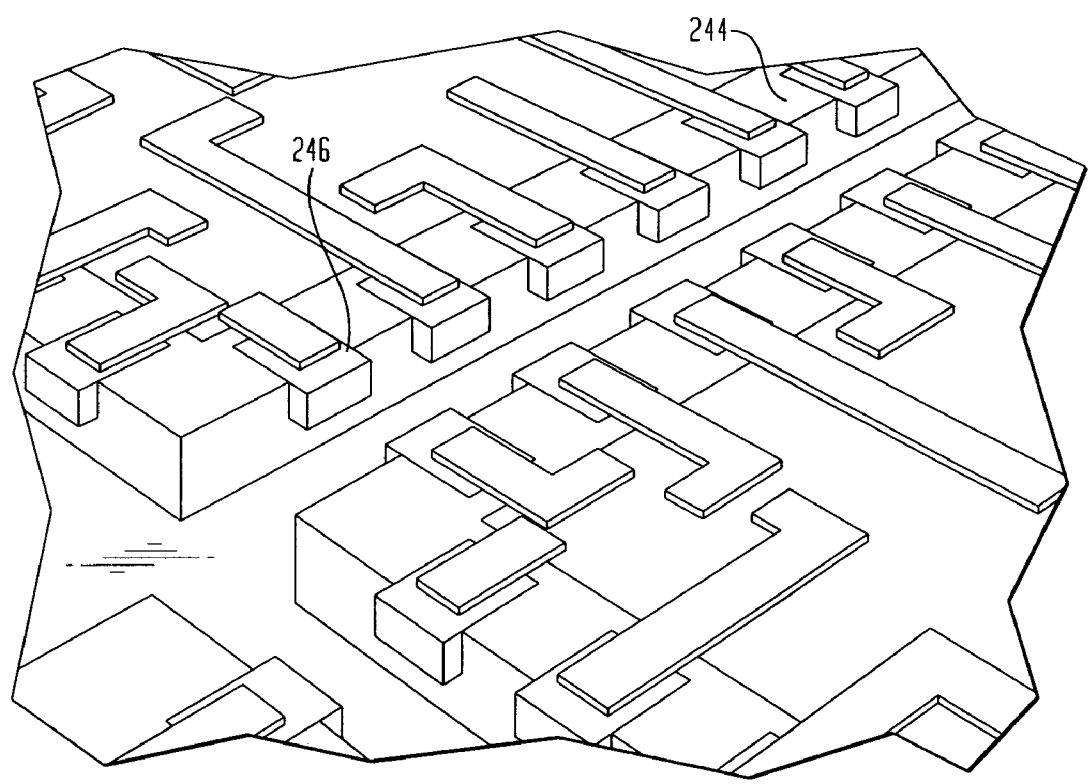
Figure 2I:
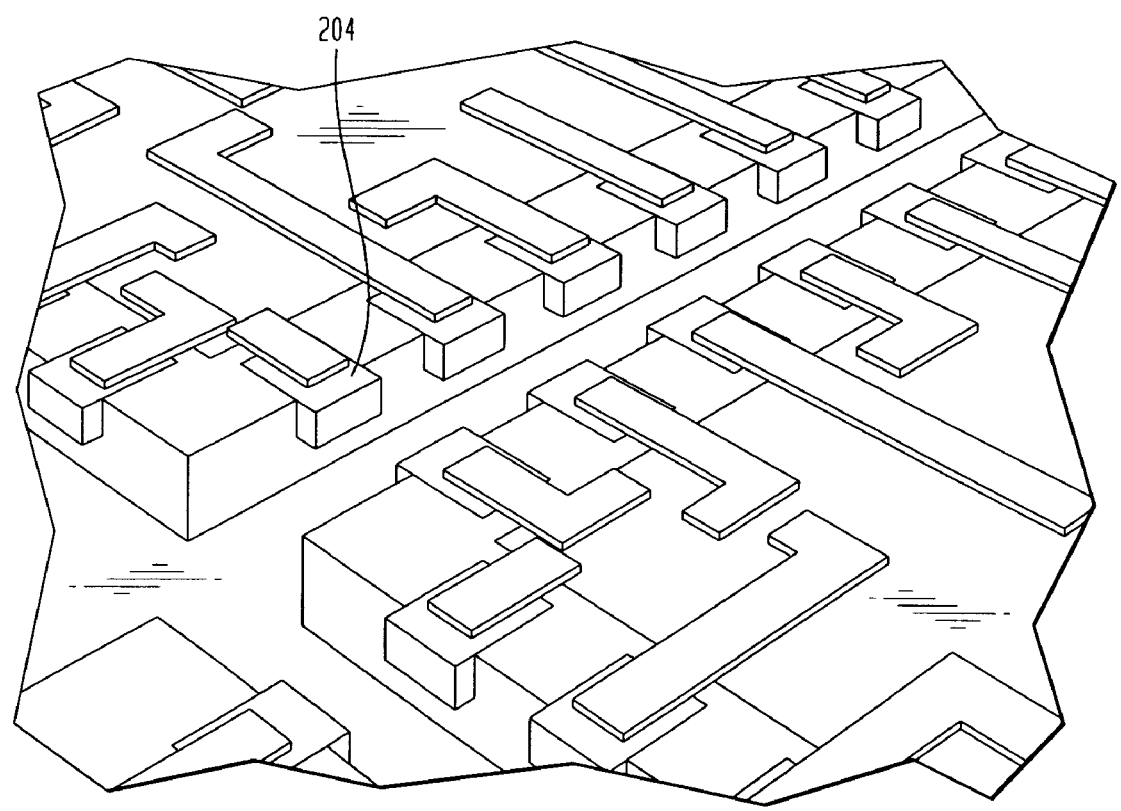

FIGS. 2A, 2B, 2C, 2D, 2E, 2F, 2G, 2H and 2I illustrate a process for forming microchips of the present invention. The various features shown in FIGS. 2A, 2B, 2C, 2D, 2E, 2F, 2G, 2H and 2I are not drawn to scale and many features have been enlarged to better show detail. In FIG. 2A a semiconductor wafer 202 is shown including microchips 204 each of which is separated from a neighboring microchip 204 by spacer regions 206. Trenches 210 are etched in spacer regions 206 alongside edges 212 of each microchip 204 as shown in FIG. 2B. FIG. 2C shows trenches 210 in one spacer region 206 in greater detail. Next, the exposed surfaces of trenches 210 are passivated by forming an oxide layer 216 on the exposed surfaces of trenches 210 by using a known semiconductor oxidation technique. The passivation of trenches 210 electrically isolates the metal interconnect nodules (described below) that are deposited in the holes from the rest of semiconductor wafer 202. Then a resist coating is applied to wafer 202. After the resist coating is applied, the resist coating is removed from trenches 210 to form openings. Then, metal is deposited into trenches 210 through the openings in the resist. Next the resist is removed. An electroless plating process is then applied to the deposited seed metal to form metal interconnect nodules 224, as shown in FIG. 2E. Then metal interconnect nodules 224 are subject to chemical mechanical polishing (CMP). The appearance of metal interconnect nodules 224 after polishing is shown in FIG. 2F. Intermetal dielectric material is then deposited prior to forming electrical connections 232 with on-chip wiring (not shown) as shown in FIG. 2G. After electrical connections 232 are formed, microchips 204 that include interconnect nodules 224 and spacer regions 244 are separated from each other using DRIE. FIG. 2H shows wafer 202 as wafer 202 appears after DRIE with portions 246 still connecting microchips 204. FIG. 2H also shows how spacer regions 244 may be further etched between interconnect nodules 224 so that interconnect nodules 224 protrude laterally from chips 204. Final separation of microchips 204 from each other may be completed by backside wafer thinning. Separated microchips 204 are shown in FIG. 2I. The semiconductor wafer of FIGS. 2A, 2B, 2C, 2D, 2E, 2F, 2G, and 2H may be made of any type of semiconductor material such as Si, GaAs, etc.

In one embodiment of the present invention, instead of the oxide layer 216, the surfaces of the trenches 210 are passivated using PECVD nitride. Other methods of passivating the surfaces of the trenches include PECVD oxide, sputtered oxide, low-k dielectrics, or other dielectric materials.

A seed may then be applied to trenches prior to depositing metal in the trenches to ensure that the deposited metal will end up in the trenches and not elsewhere on the silicon wafer. Suitable seed materials for the purposes of the present invention are well known to those in the art.

In one embodiment the holes in the semiconductor wafer used to mold the interconnect nodules are formed by photolithography and DRIE. Other methods of forming the trenches of the present invention include such lithographic techniques as electron beam, x-ray, extreme ultraviolet and any other method that may be used to form patterns on a semiconductor substrate. Also, the trenches may be formed by RIE, isotropic wet etching and other suitable etching techniques.

Chemical mechanical polishing (CMP) techniques that may be used in polishing metal interconnect nodules of the present invention include suitable planarization methods used with semiconductor wafers.

Although in FIG. 2G, for simplicity, only one layer of electrical connections between the metal interconnect nodules and on-chip wiring is shown, in actual chips there may be multiple layers of electrical connections. Electrical connections may be made from any layer of the on-chip wiring to the interconnect nodules of the present invention.

The interconnect nodule metallization plating may be copper, gold, or other malleable low-resistance material with an overlay of a flowable solder material, although pure metals such as copper or gold alone may be used with an ultrasonic weld step.

Exposure of the interconnect nodules to form protruding interconnect nodules may be accomplished by performing first an anisotropic etch for depth below the nodules, with substrate material remaining directly beneath the nodules, followed by an isotropic etch that causes the vertical surfaces of the die to recede, allowing the nodules to protrude beyond the edges of the die. Large interconnect nodules and large pitches may be exposed by using isotropic etching or crystallographic etching, whereas small nodules and fine pitch may require both anisotropic and isotropic etch techniques combined. Large pitch exposure could be accomplished using isotropic etching or crystallographic etching, either by plasmas such as those containing $SF_6$, liquids such as KOH solutions, or vapors such as $XeF_2$. Other chemistries could also be used.

In quilt packaging systems of the present invention, the interconnect nodules of two microchips of the present invention may be placed in electrical communication with each other by thermomechanical or ultrasonic bonding, heat welding, laser welding, etc. Other particular techniques for electrically connecting the interconnect nodules of the present invention are described below.

Figure 3:
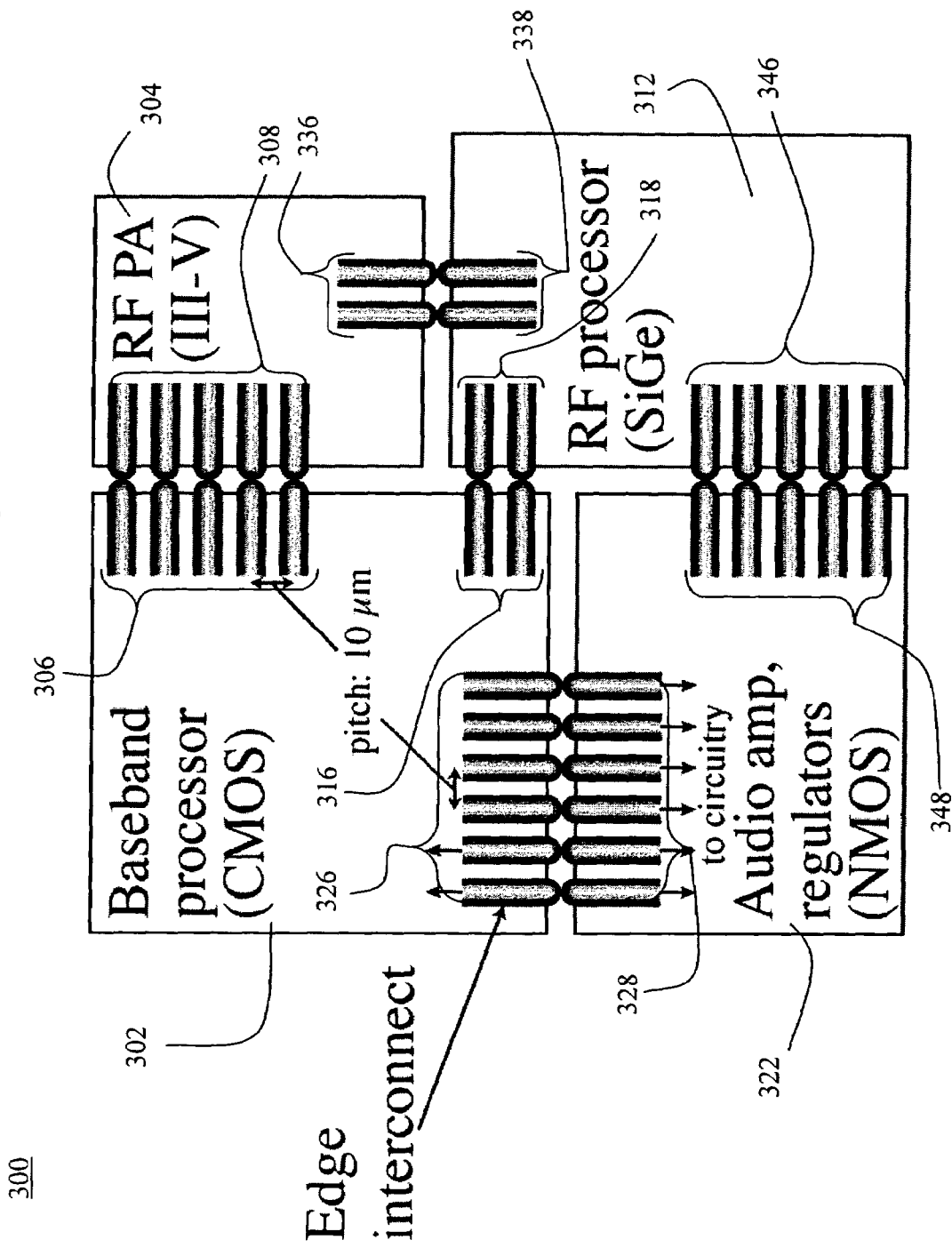
FIG. 3 is a schematic illustration of a system-in-package architecture for mobile telephony using a quilt packaging system of the present invention.

FIG. 3 shows one system-in-package architecture 300 for mobile telephony using a quilt packaging system in accordance with one embodiment of the present invention. In FIG. 3 a baseband processor microchip 302 with CMOS is directly electrically connected to a III-V based power amplifier microchip 304 by interconnect nodules 306 and 308 of microchip 302 and microchip 304, respectively. Microchip 302 is directly electrically connected to an RF signal processing block microchip 312 with SiGe HBTs (Heterostructure Bipolar Transistors) by interconnect nodules 316 and 318 of microchip 302 and microchip 312, respectively. Microchip 302 is connected to an NMOS-based audio amplifier and voltage regulator sub-block microchip 322 by interconnect nodules 326 and 328 of microchip 302 and microchip 322, respectively. Microchip 304 is directly electrically connected to microchip 312 by interconnect nodules 336 and 338 of microchip 304 and microchip 312, respectively. Microchip 312 is directly electrically connected to microchip 322 by interconnect nodules 346 and 348 of microchip 312 and microchip 322, respectively.

Figure 4:
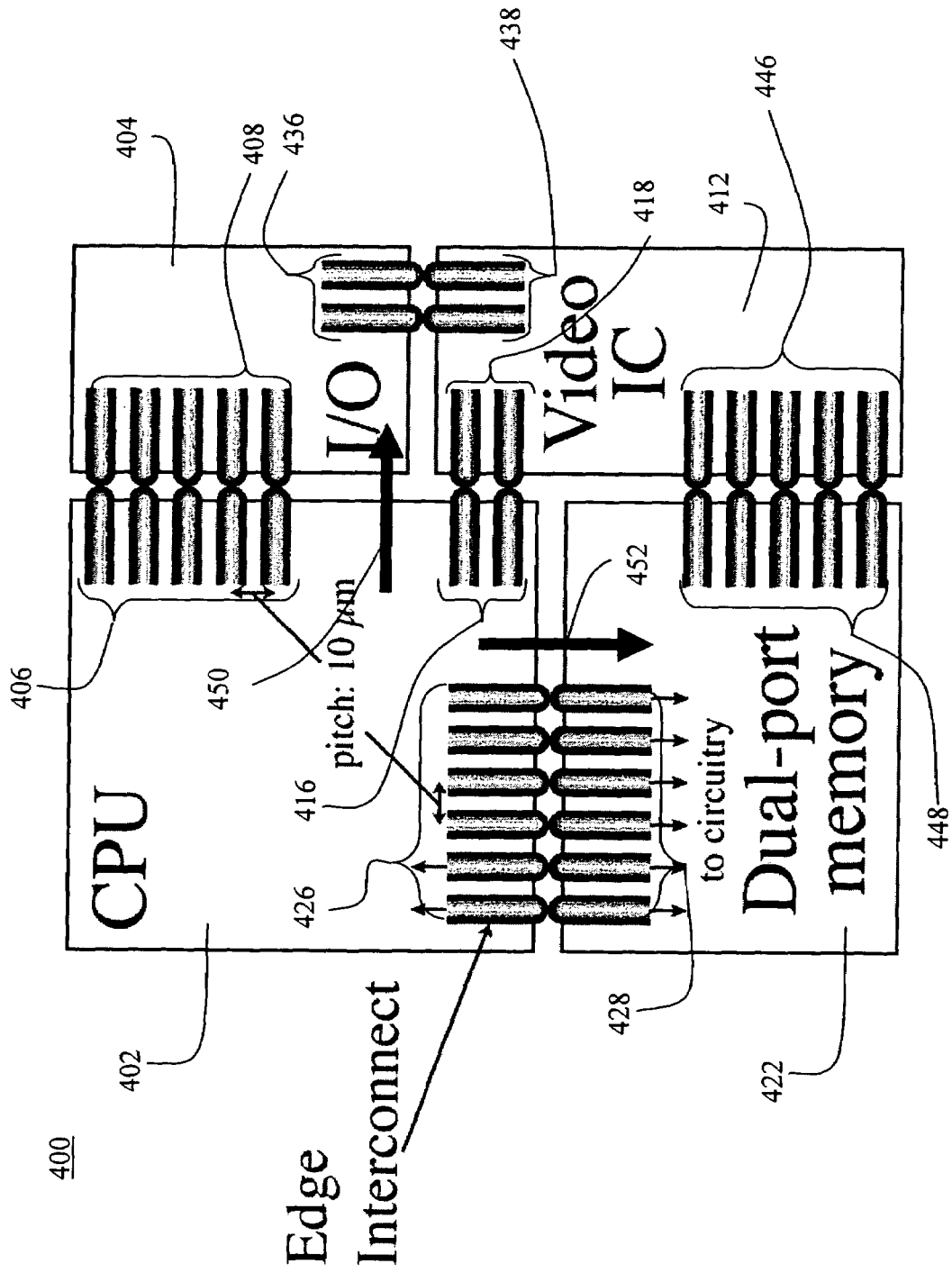
FIG. 4 is a schematic diagram of a digital system using a quilt packing system in accordance with one embodiment of the present invention.

FIG. 4 shows a system-in-package architecture 400 for one digital processing system using a quilt packaging system in accordance with one embodiment of the present invention. In FIG. 4 a CPU 402 is directly electrically connected to an I/O microchip 404 by interconnect nodules 406 and 408 of microchip 402 and microchip 404, respectively. Microchip 402 is directly electrically connected to Video IC microchip 412 by interconnect nodules 416 and 418 of microchip 402 and microchip 412, respectively. Microchip 402 is connected to dual-port memory microchip 422 by interconnect nodules 426 and 428 of microchip 402 and 422, respectively. Microchip 404 is directly electrically connected to microchip 412 by interconnect nodules 436 and 438 of microchip 404 and microchip 412, respectively. Microchip 412 is directly electrically connected to microchip 422 by interconnect nodules 446 and 448 of microchip 412 and microchip 422, respectively.

In addition, the quilt packaging system of the present invention may provide cooling of hot components in a quilt package system by allowing for heat transfer between hotter and cooler components. For example, in FIG. 4 heat from microchip 402 may flow to microchips 404 and 422 as indicated by arrows 450 and 452 due to direct thermal contact between microchip 402 and microchips 404 and 422.

Figure 5:
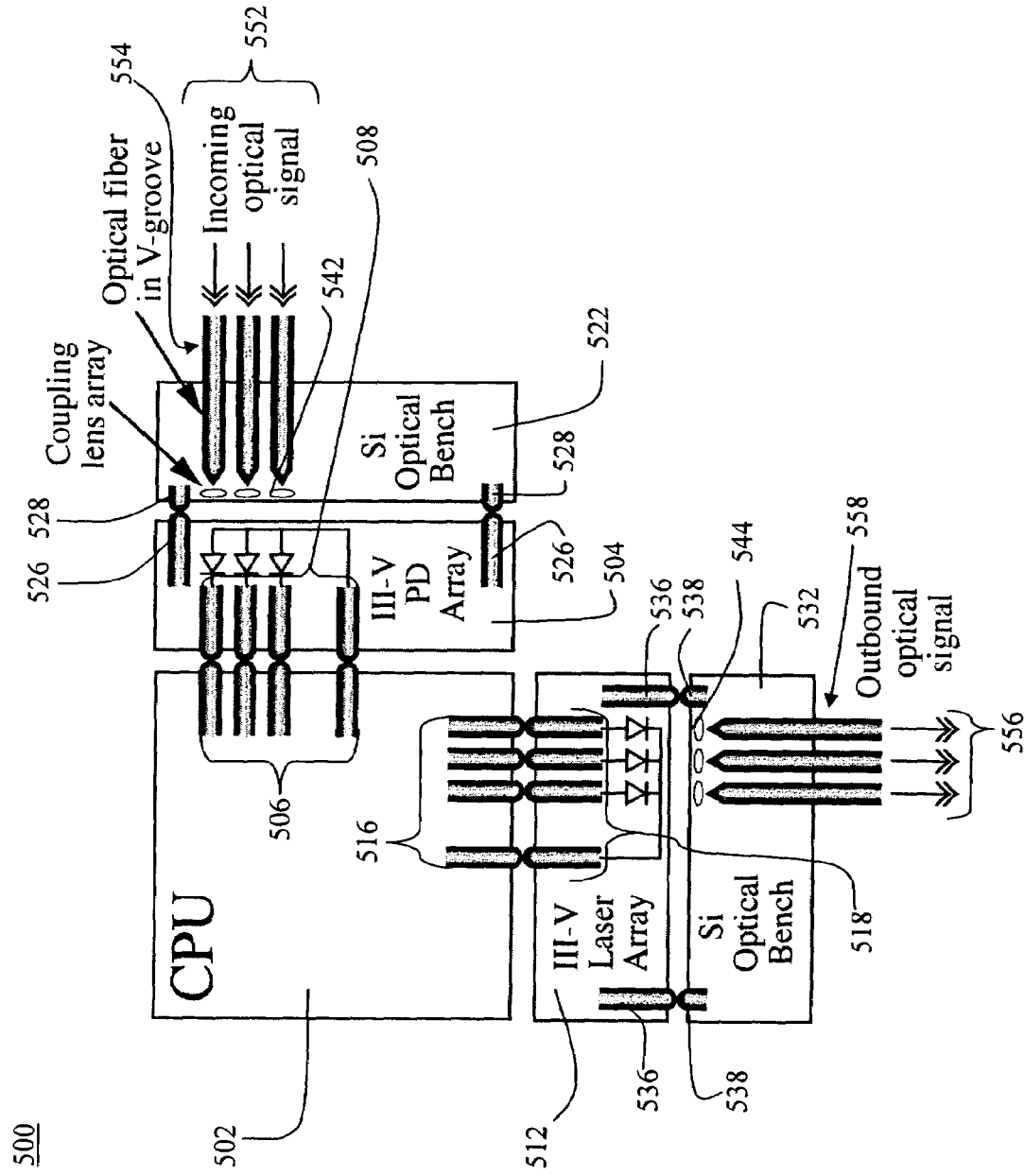
FIG. 5 is a schematic diagram of a optical communication system using a quilt packing system in accordance with one embodiment of the present invention.

FIG. 5 shows a system-in-package architecture 500 for optical communication system using a quilt packaging system in accordance with one embodiment of the present invention. In FIG. 5 a CPU 502 is directly electrically connected to a III-V PD (Photo Diode) Array microchip 504 by interconnect nodules 506 and 508 of microchip 502 and microchip 504, respectively. Microchip 502 is directly electrically connected to a III-V laser array microchip 512 by interconnect nodules 516 and 518 of microchip 502 and microchip 512, respectively. Microchip 504 is connected to Si optical bench microchip 522 by interconnect nodules 526 and 528 of microchip 504 and 522, respectively. Microchip 512 is directly electrically connected to a Si optical bench microchip 532 by interconnect nodules 536 and 538 of microchip 512 and microchip 532, respectively. Microchip 522 includes a coupling lens array 542 and microchip 532 includes a coupling lens array 544. Incoming optical signals 552 enter microchip 522 by optical fibers 554 extending into microchip 522 and outbound optical signals 556 exit microchip 532 by optical fibers 558 extending from microchip 532.

The pitch of the interconnect nodules in FIGS. 3 and 4 is shown as being 10 μm, but other pitches may be used as well depending on the size of the chips and interconnect nodules used.

As SiP architectures of FIGS. 3, 4 and 5 illustrate, ICs or other electronic devices that are fabricated with dramatically different processes may be integrated together in a single package, raising the possibility of integration with III-V and other devices (e.g. III-V power amplifiers, SiGe low-noise amplifiers, etc.) for RF communications, as well as the functional integration of silicon-based circuits utilizing incompatible fabrication processes. This is of course only one example of this technology's potential application; any system requiring compact integration of devices, sensors, and integrated circuits can be interconnected using this technique, and reap the benefits of compact implementation and high-performance electrical interconnections. It is important to note that the quilt packaging approach does not preclude the simultaneous use of other dense packaging approaches, including conventional wire bonding, flip chip, and ball grid array techniques. Edge interconnection using interconnect nodules is complementary and can be used to augment these preexisting approaches.

The present invention provides a novel solution to the problem of continued proliferation of interconnect pads following Rent's rule (P. Christie and D. Stroobandt, "The Interpretation and Application of Rent's Rule," *IEEE Trans. on VLSI Systems, Special Issue on System-Level Interconnect*

*Prediction*, vol. 8, no. 6, pp. 639-648, 2000) and the increase in number of logic gates per die-on-wafer as predicted by the ITRS.

Irvine Sensors Corporation, Costa Mesa, Calif. has made attempts to solve the problem of the proliferation of interconnect pads using stacked memory die techniques. This technique makes use of a 3D packaging concept, but requires chips to be thinned, stacked, and interconnected both through the wafers and along the edges of the stacks.

The quilt packaging system of the present invention provides at least three advantages compared to the Irvine Sensors techniques. First, the quilt packaging system of the present invention provides better thermal control, since each die is heat-sinked directly to a package substrate. Secondly, the quilt packaging system of the present invention provides higher speed, since each microchip may be contiguous with one or more other die, and possibly more if several smaller die are adjacent to a large one, for example as shown in the baseband processor of FIG. 4. Another advantage of the quilt packing technique of the present invention is that the system may be used to achieve wide-bandwidths while remaining resonance-free, by avoiding the electromagnetic discontinuity arising from the radical changes in transmission line properties for horizontal to vertical interconnects. Such issues will become critical as signal frequencies extend well into the multi-GHz regime. By virtue of its planar geometry, the quilt packaging system of the present invention may provide ultra-wide interconnect bandwidths and excellent signal integrity. Many benefits and opportunities resulting from the quilt packaging system are discussed below.

The quilt packaging system of the present invention provides high-speed, high-signal-integrity chip-to-chip interconnects. The quilt packaging system of the present invention may also provide high-speed, low-loss, and low-noise characteristics for critical applications within SiPs. A high-speed interface with good signal integrity performance may be provided by the quilt packaging system of the present invention due to the edge interconnect geometry. The quilt interconnect geometry essentially results in an extension, from one chip to the next, of the same planar interconnect geometry as is used within a chip. As a consequence of this preservation of the conventional on-chip interconnect geometry, the electromagnetic discontinuities that are inherent in wirebond-based interconnects (and to a lesser degree in flip-chip implementations) may be eliminated almost entirely. This permits resonance-free high-speed interconnects to be designed and fabricated that exhibit a minimum of signal and ground bounce, overshoot, or ringing. In addition, the ability to connect die that are fabricated with completely different fabrication processes and materials make SiPs based on a variety of heterogeneous technologies possible, including CMOS, Si and SiGe bipolar, III-V semiconductors, and MEMS. A feature of one embodiment of the present invention is that each piece of the SiP may be fabricated most efficiently using the best technology for its specific function without compromising either cost or performance due to manufacturing multiple technologies on a single substrate. As shown in FIGS. 3, 4 and 5, the major components of a mobile telephony handset, digital system, optical communications system, or other advanced system using heterogeneous IC technologies may be integrated in a single package through quilt packaging. This integration results in a unique combination of exceptional power and energy efficiency, cost efficiency, flexibility in fabrication and individual function optimization (e.g. SiGe RF processor/LNA, III-V power amplifier, CMOS baseband processor), and high interconnect performance. Such heterogeneous integration across disparate material systems and fabrication processes permits straightforward and cost-effective SiP implementations.

The quilt packaging system of the present invention also provides a low cost packaging system for microchips, even with increased system performance. The quilt packaging system of the present invention may allow the combining of multiple die into a single package with increased speed and lower noise, as well as with greatly increased design flexibility since each microchip may be fabricated using different technologies and/or material systems. The need for fewer packages, which add significantly to the final microchip cost, may lower the system cost considerably. Conventional wafer-level packaging (WLP) and chip-scale packaging (CSP) technologies are often regarded as best suited for economical but lower-performance packaging needs. However, the quilt packaging system of the present invention may be used to extend WLP's reach into higher performance applications as well. Additionally, significantly less PCB area may be required for a quilt packaging system of the present invention due the use of a smaller number of enhanced-functionality packages. The limitation of PCB technology in terms of wiring pitch, etc. is less problematic for a quilt packaging system of the present invention since many of the interconnects are routed directly between chips, and system reliability may be improved due to the easing of PCB layer constraints and the use of fewer packages to fail. In fact, for applications in remote sensing and bio-chemical agent detection, the entire system (sensor, processing electronics, and wireless communication ICs) may be integrated within a single quilt package system with no need for a PCB at all. This offers an opportunity for dramatic decreases in cost and increases in deployability over prior packaging systems.

The quilt packaging system of the present invention offers high chip real estate efficiency. By using the quilt packaging system of the present invention, support circuitry such as pad drivers and electrostatic discharge (ESD) protection may be obviated for many signal lines since ICs will interface directly to each other within a single package rather than to long wires (wire bonds and PCB traces) with connections to the outside world and thus subject to ESD. This will result in even greater savings in chip real estate, enhanced reliability from the standpoints of both improved system ESD immunity and that of manufacturing (omission of ESD circuitry), and enhanced energy efficiency.

The quilt packing system of the present invention provides lower kerf losses than current packaging systems. Manufacturing costs for quilt packaging systems are lower than for current packaging systems due to the "free" streets for die-on-wafer separation without the need for wafer sawing. The ITRS indicates that die sizes will saturate and may even shrink toward the year 2016. In this case, it is unlikely that wafer dicing saw technology will keep pace, so a continually larger fraction of the wafer area will be dedicated to kerf and sawing issues. Using the DRIE separation technique as part of one method for making the quilt packaging system of the present invention, the improved areal efficiency may result in additional die per wafer. For example, in today's 200 mm wafer technology, elimination of the streets would result in about 4 additional 10×10 mm die per wafer. This savings would of course increase further for die on 300 mm wafers.

Figure 7:
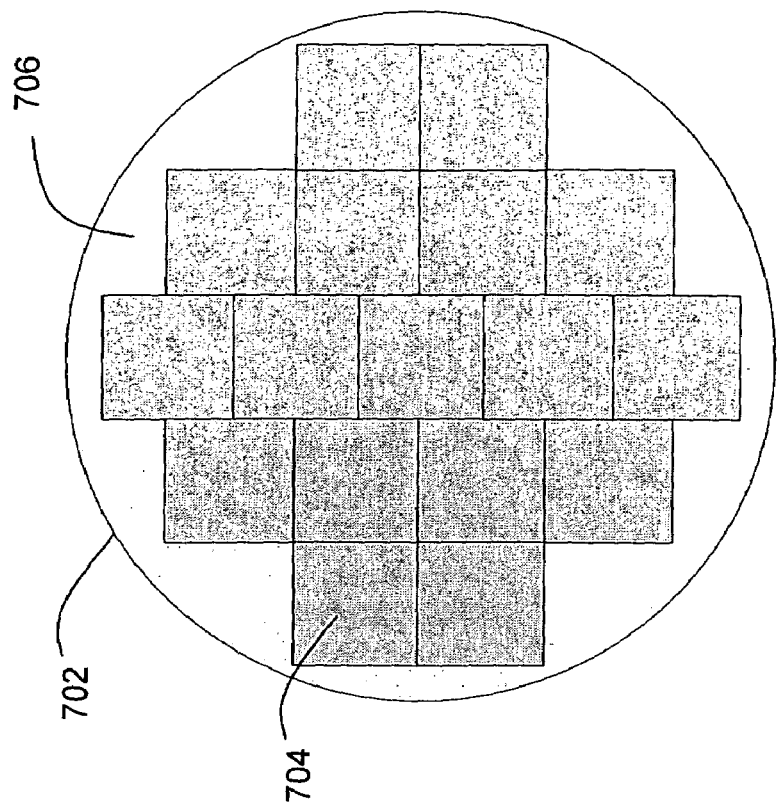
FIG. 7 is a schematic diagram of a wafer with square microchips in accordance with one embodiment of the present invention.
Figure 6:
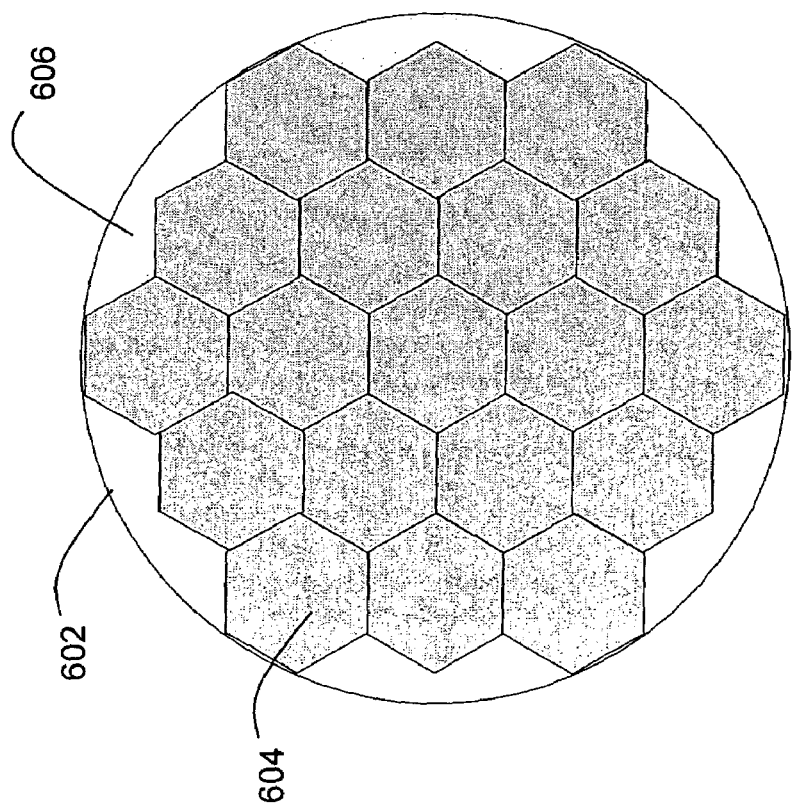
FIG. 6 is a schematic diagram of a wafer with hexagonal microchips in accordance with one embodiment of the present invention.

In one embodiment, the present invention provides a non-rectangular microchip. FIG. 6 shows a wafer 602 having 19 hexagonal microchips 604 formed thereon and having wasted space 606. FIG. 7 shows a wafer 702 having 17 square microchips 704 formed thereon and having wasted space 706. As can be seen in FIGS. 6 and 7, for chips having similar areas, more hexagonal chips may be formed from a given wafer and there is less wastage. In one embodiment of the present invention, forming hexagonal chips rather than rectangular may result in an increase in wafer space utilization that provides significant economic value.

Figure 8:
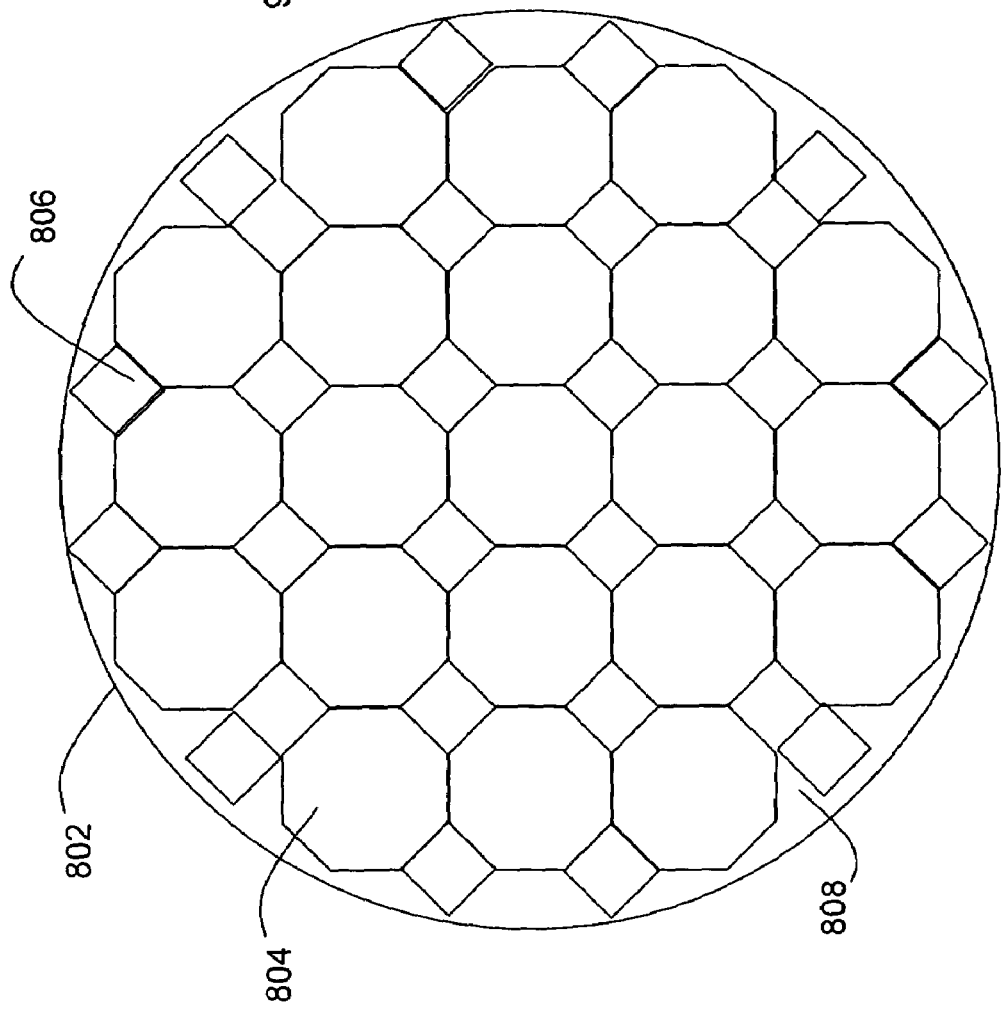
FIG. 8 is a schematic diagram of a wafer with octagonal and square microchips in accordance with one embodiment of the present invention.

In another embodiment, the present invention provides octagonal microchips. FIG. 8 illustrates how a wafer 802 may have octagonal microchips 804 formed thereon. In between octagonal microchips 804 are square microchips 806. Surrounding microchips 804 and microchips 806 is wasted space 808.

Figure 9:
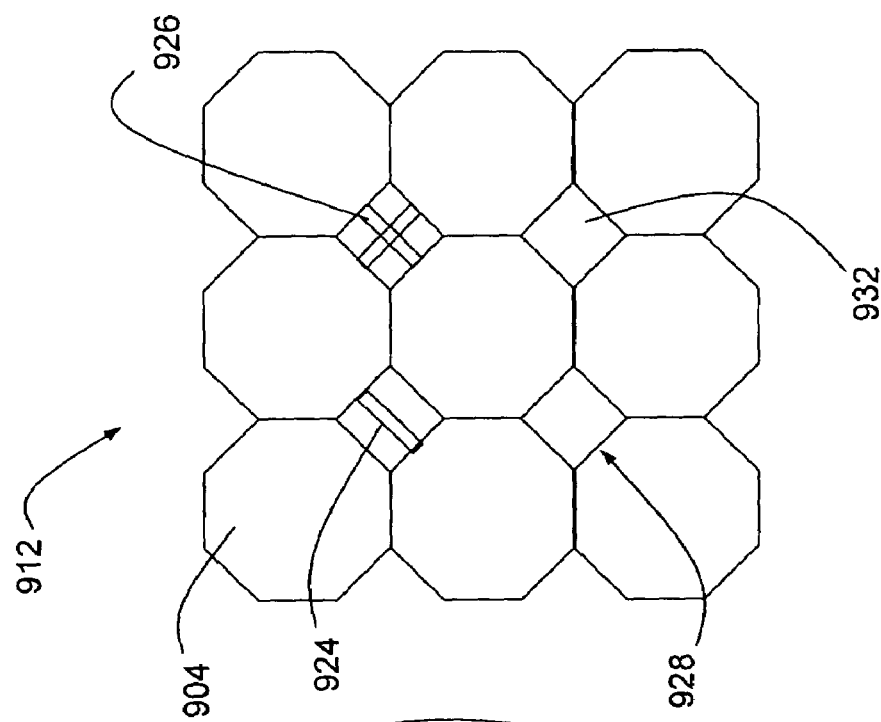
FIG. 9 is a schematic diagram of octagonal microchips of FIG. 8 in a quilt packaging system of the present invention.

Although octagonal and square microchips are shown being formed on the same wafer in FIG. 9, in some embodiments of the present invention, it may be desirable to form only octagonal chips on a given wafer.

FIG. 9 shows how octagonal microchips 904 may be arranged in a quilt packaging system 922 of the present invention. Between one set of two microchips 904 is an interposer 924 that provides a bi-directional electrical connection. Between two microchips 904 is an interposer 926 that provides a quadra-directional electrical connection between four microchips 904. Instead of interposers 924 or 926, other square microchips 932 could be placed.

Although connections are shown between the octagonal microchips in FIG. 9, in other embodiments of the present invention, there may simply be openings between the octagonal microchips to allow for cooling and other purposes.

As illustrated in FIGS. 6, 7, 8 and 9, microchips all having the same shape or having different shapes may be formed on the same wafer. Although in the embodiments described above, the chips all have regular convex shapes, the microchips of the present invention may have various types of convex shape such as triangular, rectangular, circular, rhomboid, etc. and may or may not be bilaterally or rotationally symmetric. The microchips of the present invention may even have simple or complex non-convex shapes.

Although the quilt packaging system does not require the use of alignment devices on the microchips, in some embodiments of the present invention the microchips of the present invention include alignment means for aligning of wafers during assembly, which provides increased speed and reliability during manufacturing. The microchips of the present invention also provide for non-conventional ways of obtaining electrical connections on microchip edges. In addition, in at least some embodiments the microchips of the present invention allow for increasing the flexibility of wafer connections and speeds the manufacturing process.

Although the embodiment of the present invention so far described relates primarily to connecting microchips of the present invention to be direct-conductively connected to each other, the microchips of the present invention may be connected with PCBs or other devices. For example, the microchips of the present invention may be direct-conductively connected to PCBs.

Figure 10B:
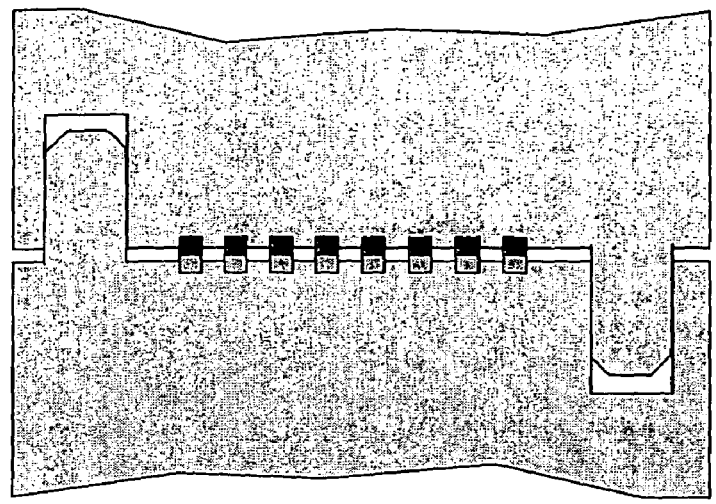
FIG. 10B is a schematic partial top view of the two microchips of FIG. 10A, wherein the two microchips are aligned and the interconnect nodules of the two chips are in electrical communication with each other.
Figure 10A:
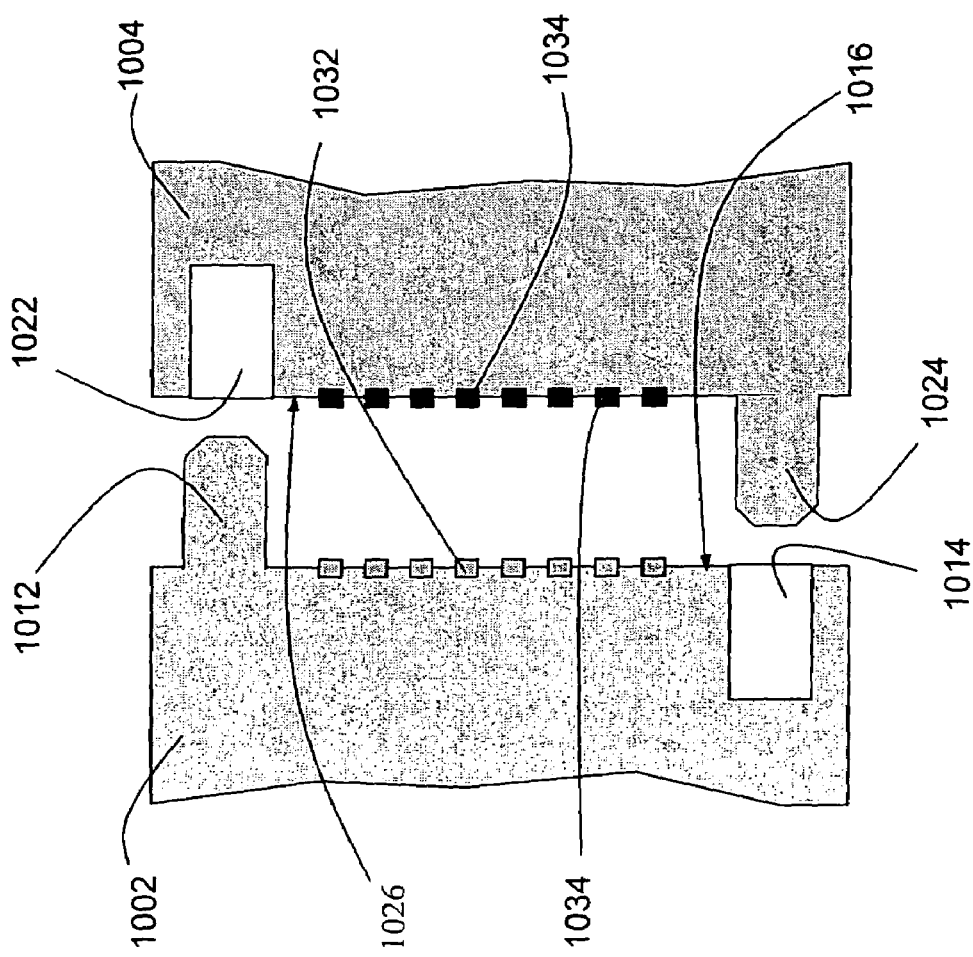
FIG. 10A is a schematic partial top view of two microchips of the present invention including tabs and notches for aligning interconnect nodules on the two microchips with each other.

In one embodiment of the present invention, the microchips may have complex shapes and include means for aligning the interconnect nodules with each other or with other devices such as PCBs or other chips to which the microchips of the present invention are electrically connected, as illustrated, for example, in FIGS. 10A and 10B. Such aligning means may take the form of tabs, pins, etc. and may be unitary with the rest of the microchip or may be embedded or attached to the microchips during manufacturing. FIG. 10A shows two microchips 1002 and 1004 of the present invention and FIG. 10B shows microchips 1002 and 1004 in electrical communication. Microchip 1002 has an integral alignment tab 1012 and an alignment notch 1014 on an edge 1016 of microchip 1002. Microchip 1004 has an integral alignment notch 1022 and an alignment tab 1024 on an edge 1026 of microchip 1004. As shown in FIG. 10B, alignment tab 1012 fits into alignment notch 1022 and alignment tab 1024 fits into alignment notch 1014 to align respective interconnect nodules 1032 and 1034 of microchips 1002 and 1004 when interconnect nodules 1032 and 1034 make contact with each other.

The means for aligning two electrically connected microchips of the present invention may restrict the motion of the two connected microchips along the axis that the microchips are in electrical communication. FIG. 11A shows microchips 1102 and 1104 being slid along an axis of motion 1106 into engagement with each other. FIGS. 11B, 11C and 11D show microchips 1102 and 1104 in electrical communication with each other. Microchip 1102 has an integral trapezoidal alignment tab 1112 on an edge 1116 of microchip 1102. Microchip 1104 has a trapezoidal alignment notch 1124 on an edge 1126 of microchip 1104. As shown in FIG. 11C, alignment tab 1112 fits into alignment notch 1124 to align respective interconnect nodules 1132 and 1134 of microchips 1102 and 1104 when interconnect nodules 1132 and 1134 make contact with each other. Also, the shapes of alignment tab 1112 and alignment notch 1124 restrict the motion of microchips 1102 and 1104 along axis 1142 of electrical communication between interconnect nodules 1132 and 1134.

FIGS. 12A, 12B, 12C, and 12D show another embodiment of the present invention that includes a means for aligning two electrically connected microchips and restricting the motion of the two connected microchips along the axis that the microchips are in electrical communication. FIG. 12A shows microchips 1202 and 1204 being rotated together in the direction shown by arrows 1206 into engagement with each other. FIGS. 12B, 12C and 12D show microchips 1202 and 1204 in electrical communication with each other. Microchip 1202 has an integral trapezoidal alignment tab 1212 on an edge 1216 of microchip 1202. Microchip 1204 has a trapezoidal alignment notch 1224 on an edge 1226 of microchip 1204. As shown in FIG. 12C, alignment tab 1212 fits into alignment notch 1224 to align respective interconnect nodules 1232 and 1234 of microchips 1202 and 1204 when interconnect nodules 1232 and 1234 make contact with each other. Also, the shapes of alignment tab 1212 and alignment notch 1224 dovetail with each other and restrict the motion of microchips 1202 and 1204 along axis 1242 of electrical communication between interconnect nodules 1232 and 1234.

Although in the embodiments so far discussed, the interconnect nodules have been located along a smooth edge of a microchip, the present invention also includes microchips where the interconnect nodules may be aligned on tabs and notches where the interconnect nodules are mounted. For example, FIGS. 13A and 13B show two microchips 1302 and 1304 having respective modulated edges 1306 and 1308. Modulated edge 1306 includes tabs 1312 and notches 1314 in which there are mounted tab interconnect nodules 1316 and notch interconnect nodules 1318. Modulated edge 1308 includes tabs 1322 and notches 1324 in which there are mounted tab interconnect nodules 1326 and notch interconnect nodules 1328. As shown in FIG. 13B, when microchips 1302 and 1304 are pushed together, tabs 1312 and notches 1324 align and interconnect nodules 1316 and interconnect nodules 1328 and notches 1314 and tabs 1322 align interconnect nodules 1318 with interconnect nodules 1326.

Although not shown, the tabs and notches of the microchips of FIGS. 13A and 13B may have other shapes, such as the trapezoidal shape shown in the microchips of FIGS. 11A-D and 12A-D to allow the tabs and notches to dovetail and restrict the motion of the microchips along the axis of electrical communication between the respective interconnect nodules.

Although in FIGS. 10A, 10B, 11A, 11B, 11C, 11D, 12A, 12B, 12C, 12D, 13A, and 13B show two microchips are shown being aligned with respect to each other, the present invention also envisions similar types of alignment means to align the interconnect nodules of a microchip with the electrical contacts of an electronic device that are in electrical communication with the interconnect nodules of the microchip. The internal circuitry of the microchips in FIGS. 10A, 10B, 11A, 11B, 11C, 11D, 12A, 12B, 12C, 12D, 13A, and 13B has been not shown for the purposes of simplicity.

Figure 14:
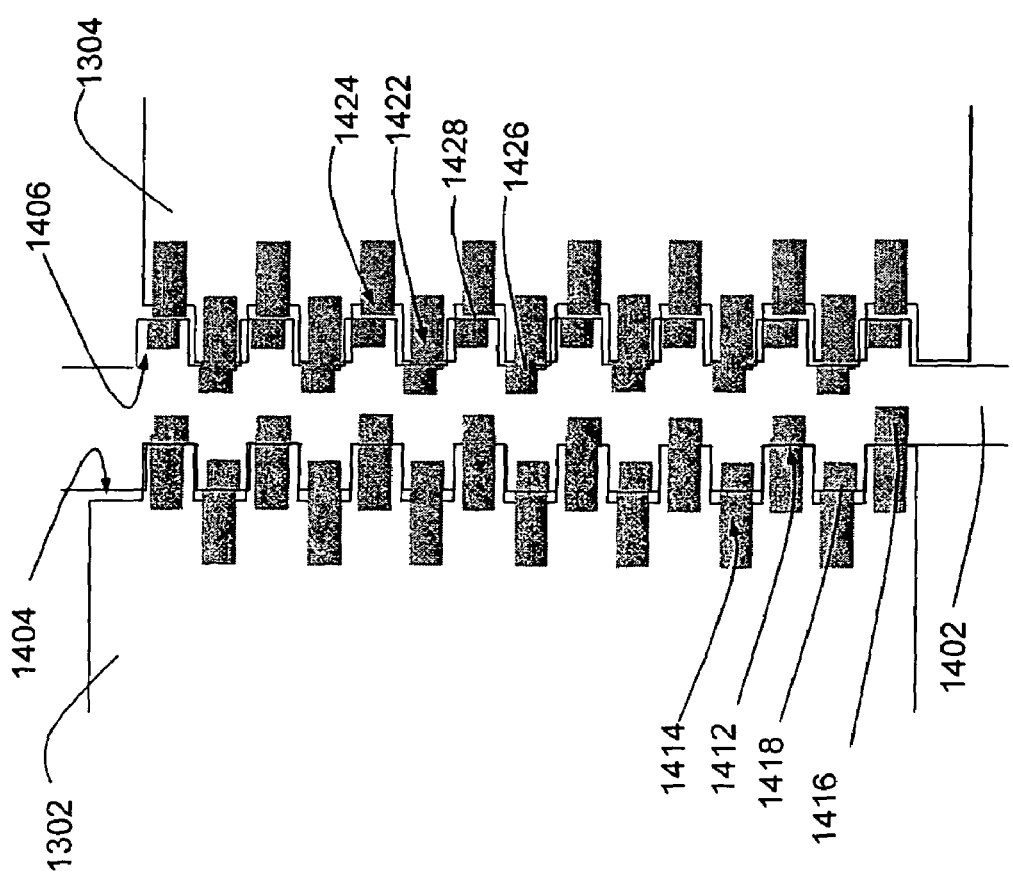
FIG. 14 is a schematic partial top view of the microchips of FIG. 13A plugged into an electrical connector in accordance with one embodiment of the present invention.

The microchips of the present invention may also be plugged into a connecting device or interposer. For example, FIG. 14 shows microchips 1302 and 1304 plugged into an electrical connector 1402 having modulated edges 1404 and 1406. Modulated edge 1404 includes notches 1412 and tabs 1414 in which there are mounted notch contacts 1416 and tab contacts 1418. Modulated edge 1406 includes notches 1422 and tabs 1424 in which there are mounted notch contacts 1426 and tab contacts 1428. Tab interconnect nodules 1316 electrically contact notch contacts 1416 and notch interconnect nodules 1318 contact tab contacts 1418. Tab interconnect nodules 1326 electrically contact notch contacts 1426 and notch interconnect nodules 1328 contact tab contacts 1428. The internal circuitry of microchips 1302 and 1304 and of connector 1402 are not shown for simplicity.

Figure 15:
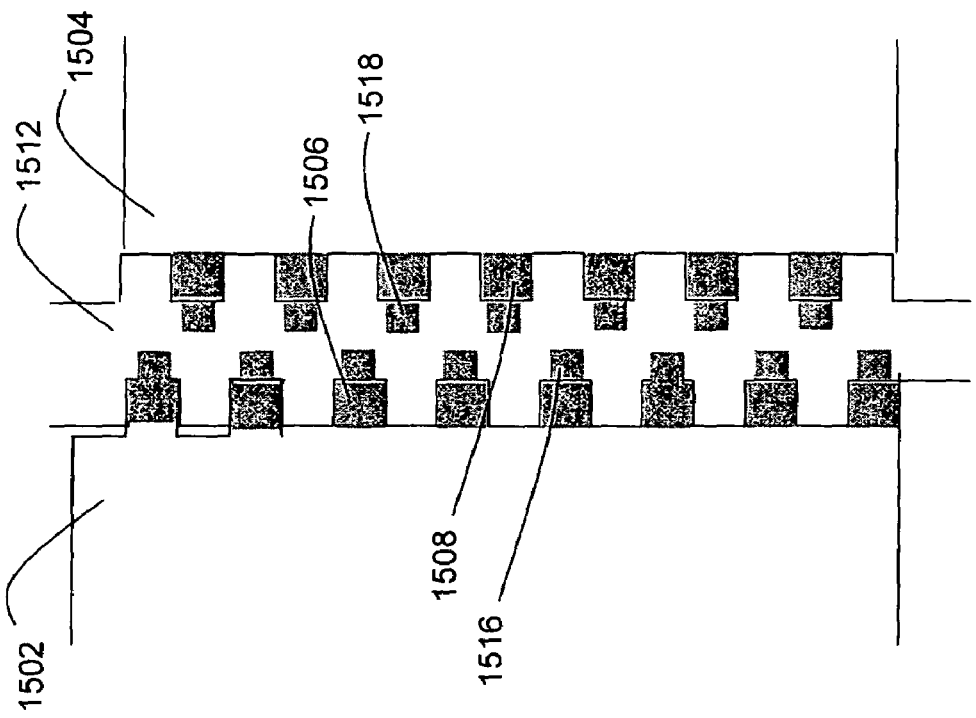
FIG. 15 is a schematic partial top view of two microchips having protruding interconnect nodules plugged into an electrical connector in accordance with one embodiment of the present invention.

FIG. 15 shows how microchips 1502 and 1504 that have protruding interconnect nodules 1506 and 1508 respectively may be plugged into an electrical connector 1512 that includes electrical contacts 1516 and 1518. Interconnect nodules 1506 make electrical contact with contacts 1516 and interconnect nodules 1508 make electrical contact with contacts 1518. The internal circuitry of microchips 1502 and 1504 and of connector 1512 are not shown for simplicity.

The electrical connectors shown in FIGS. 14 and 15 are meant to only be exemplary of the ways that a microchip of the present invention may be plugged into another electronic device. The type of connectors that may be used with the microchips of the present invention are not limited to the embodiments shown in FIGS. 14 and 15. A connector may have a series of places where microchips may be plugged into the connector, a connector may not only have places on one side of the connector where microchips may be plugged in, the connector may be part of a larger electronic device such as an amplifier, CPU, etc.

In some embodiments of the quilt packaging system of the present invention, microchips in different planes may be electrically connected. For example, FIG. 16A shows a 3-dimensional quilt package system 1602 of the present invention in which microchips 1612, 1614, 1616 and 1618 of the present invention are connected in a rectangular configuration. FIG. 16B shows how interconnect nodules 1622 and 1624 of microchips 1612 and 1614 are electrically connected to each other at a right angle. FIG. 17A shows a 3-dimensional quilt packaging system 1702 of the present invention in which microchips 1712, 1714 and 1716 of the present invention are electrically connected in a triangular configuration. FIG. 17B shows how interconnect nodules 1722 and 1724 of microchips 1712 and 1714 are electrically connected to each other at an acute angle.

Although one exemplary electrical connection of two microchips is shown in FIGS. 16B and 17B, similar connections are made between the interconnect contacts of the microchips along the other edges of each microchip where the microchips meet. Also, although two 3-dimensional shapes for a quilt packaging system of the present invention are shown in FIGS. 16A and 17A, a 3-dimensional quilt packaging system of the present invention may have any of a variety of shapes depending on the application. Among the advantages of 3-dimensional quilt packaging systems is their ability to provide cooling due to air or fluid movement along the microchip surfaces and the placement of interconnect nodules internally.

In some embodiments of the present invention, it is also possible to arrange the connected microchips in "branched" configurations such as shown in FIGS. 18 and 19. In FIG. 18, microchips 1802 and 1804 are electrically connected in a lateral direction to each other by interconnect nodules 1806 and 1808 of microchips 1802 and 1804, respectively. Microchip 1802 is electrically connected to microchip 1812 at a right angle by interconnect nodule 1814 of microchip 1812 and interconnect nodule 1806. Microchip 1804 is electrically connected to microchip 1822 at a right angle by interconnect nodule 1824 of microchip 1822 and interconnect nodule 1808.

In FIG. 19, microchips 1902 and 1904 are electrically connected to each other in the lateral direction by interconnect nodules 1906 and 1908 of microchips 1902 and 1904, respectively. Microchip 1902 is electrically connected to microchip 1912 at an acute angle by interconnect nodule 1914 of microchip 1912 and interconnect nodule 1906 of microchip 1902. Microchip 1904 is electrically connected to microchip 1922 at an acute angle by interconnect nodule 1924 of microchip 1922 and interconnect nodule 1908 of microchip 1904.

Figure 20A:
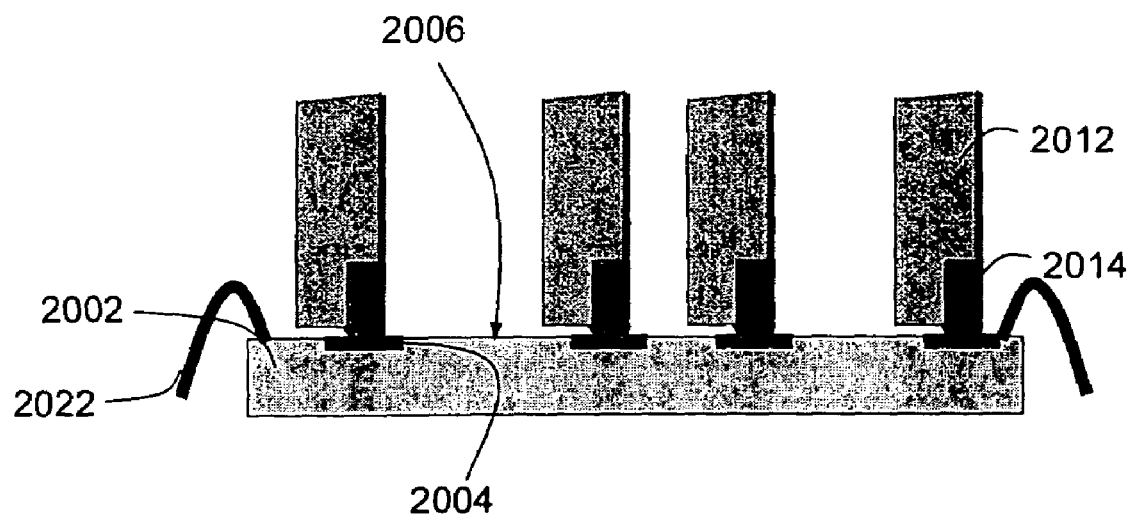
FIG. 20A is a schematic cross-sectional partial side view of a quilt packaging system including a microchip with lateral surface interconnect nodules in accordance with one embodiment of the present invention.
Figure 20B:
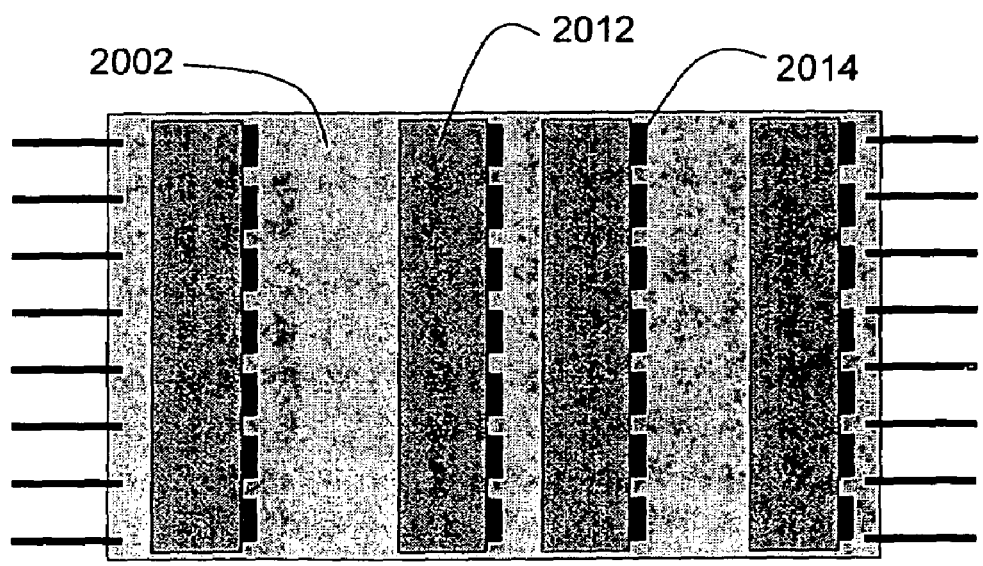
FIG. 20B is a schematic partial top view of the quilt packaging system of FIG. 20A.

Although in the previously described embodiments of the present invention, the interconnect nodules are described as being on the edges of a microchip, in other embodiments the interconnect nodules may be located on one or both lateral surfaces of a microchip or located on both the lateral surfaces and edges of a microchip. Such microchips may be formed following a procedure similar to that shown in FIGS. 2A-2I by depositing the interconnect nodules on one or both lateral surfaces of a die-on-wafer. FIGS. 20A and 20B show a microchip 2002 of the present invention having lateral surface interconnect nodules 2004 on a lateral surface 2006 of microchip 2002. Microchips 2012 have edge interconnect nodules 2014 that are electrically connected to respective interconnect nodules 2004 of microchip 2002. Microchip 2002 also includes conventional electric leads shown in the figure as wirebonds 2022. FIG. 20B shows the top view of the embodiment of FIG. 20A.

Figure 21A:
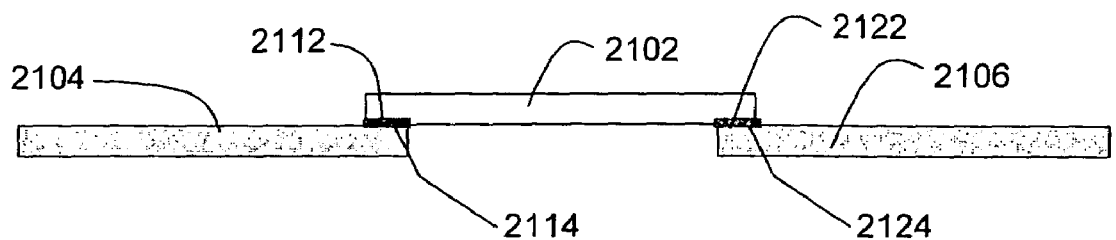
FIG. 21A is a schematic cross-sectional partial side view of a quilt packaging system in which one microchip partially overlaps two other microchips to which the microchip is electrically connected in accordance with one embodiment of the present invention.
Figure 21B:
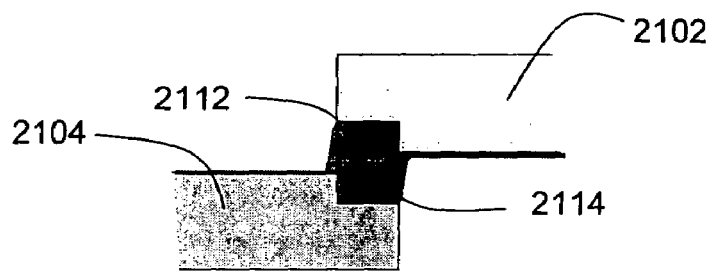
FIG. 21B is a schematic cross-sectional partial side view of the electrical connection between respective interconnect nodules of two of the microchips of FIG. 21A.
Figure 21C:
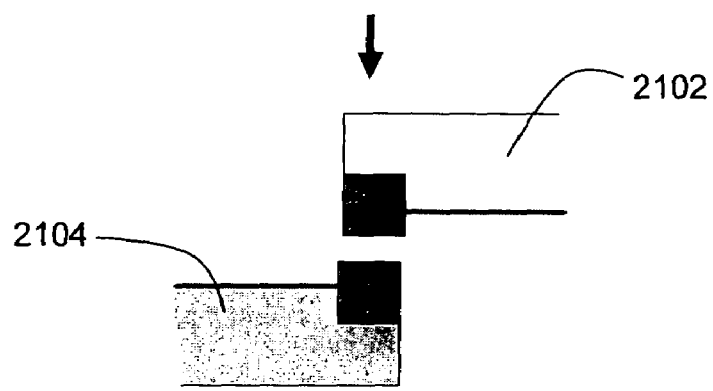
FIG. 21C is a schematic cross-sectional partial side view of the microchips of FIG. 21B before the microchips are electrically connected.

In some embodiments of the present invention, the quilt packaging system may employ face-to-face overlapping electrical connections between interconnect nodules of different microchips. For example, FIGS. 21A and 21B show a microchip 2102 that partially overlaps a microchip 2104 and a microchip 2106. Interconnect nodule 2112 of microchip 2102 makes a face-to-face electrical connection with interconnect nodule 2114 of microchip 2104. Interconnect nodule 2122 of microchip 2102 makes a face-to-face electrical connection with interconnect nodule 2124 of microchip 2106. FIG. 21C shows microchips 2102 and 2104 before they are electrically connected.

Figure 22C:
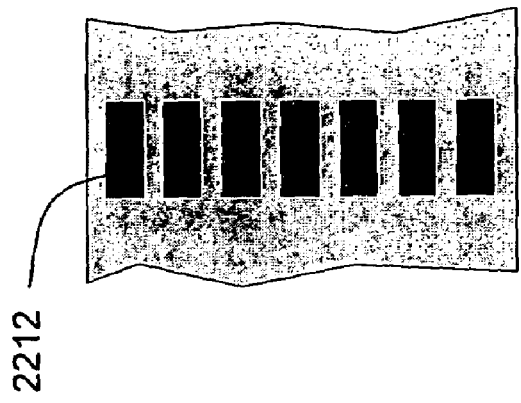
FIG. 22C is a schematic partial top view of the semiconductor wafer of FIG. 22A into which trenches have been etched in accordance with one embodiment of the present invention.
Figure 22E:
FIG. 22E is a schematic partial top view of the semiconductor wafer of FIG. 22C having a conductive material deposited in the trenches in accordance with one embodiment of the present invention.
Figure 22D:
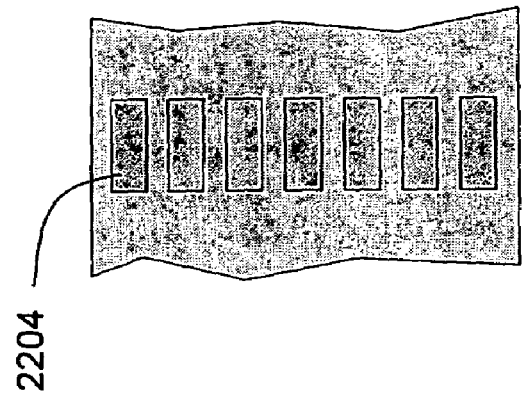
FIG. 22D is a schematic cross-sectional partial side view of the semiconductor wafer of FIG. 22C.
Figure 22F:
FIG. 22F is a schematic cross-sectional partial side view of the semiconductor wafer of FIG. 22E.
Figure 22A:
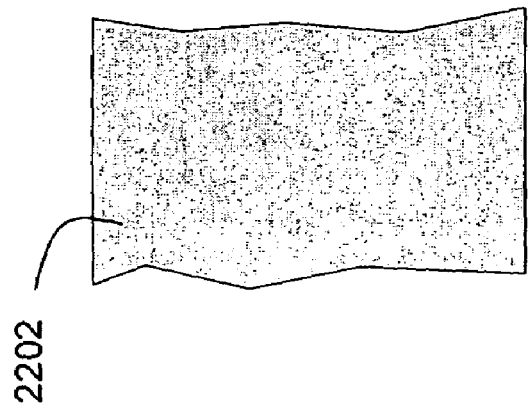
FIG. 22A is a schematic partial top view of a semiconductor wafer in accordance with one embodiment of the present invention.
Figure 22B:
FIG. 22B is a schematic cross-sectional partial side view of the semiconductor wafer of FIG. 22A.

To create contacts that protrude over the edges of the microchip, it is possible to utilize plastic deformation of conductive material, such as copper or gold, for example, deposited on the microchip. This process includes the conventional stages of microchip production along with the deposition of malleable material in the required dicing and flattening zones. An example of such a process is show in FIGS. 22A-22N. FIGS. 22A and 22B show a semiconductor wafer 2202. FIGS. 22C and 22D show trenches 2204 etched in the semiconductor wafer. FIGS. 22E and 22F show a conductive material 2212 deposited in trenches 2204. FIGS. 22G and 22H show circuitry 2214 deposited on substrate 2202. FIGS. 22I and 22J show semiconductor wafer 2202 being partially separated into two microchips 2222 and 2224 having respective interconnect nodules 2226 and 2228 by mechanical cutting using a microsaw or other cutting device, or other known processes such as focused ion beam milling. FIGS. 22K, 22L, 22M, and 22N show the conductive material 2212 of interconnect nodules 2206 being flattened by a punch 2232 to form protruding interconnect nodules 2234.

Figure 23C:
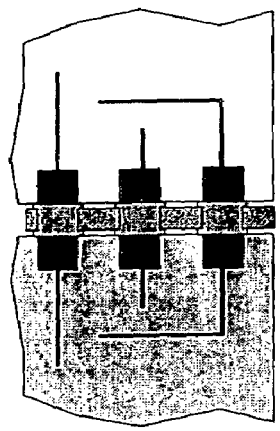
FIG. 23C is a schematic partial top view of the two microchips and intermediate electrical connector of FIG. 23A in which the two microchips are in electrical communication with the intermediate electrical connector.
Figure 23D:
FIG. 23D is a schematic cross-sectional partial side view of the two microchips and intermediate electrical connector of FIG. 23C.
Figure 23A:
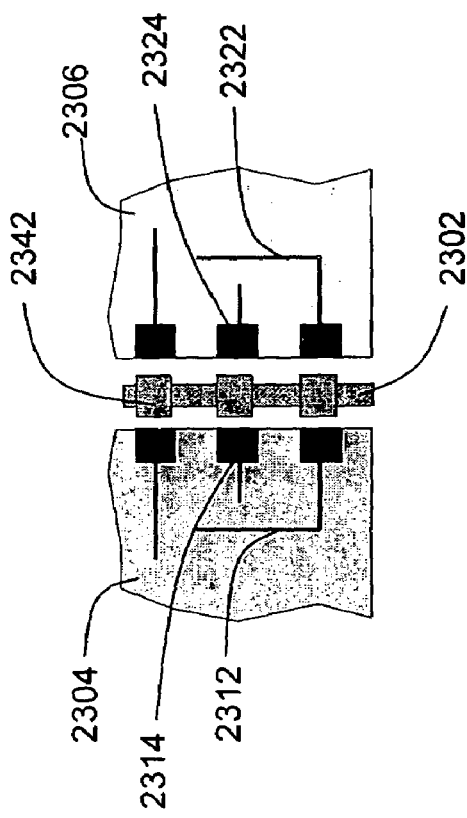
FIG. 23A is a schematic partial top view of two microchips and an intermediate electrical connector in accordance with one embodiment of the present invention.
Figure 23B:
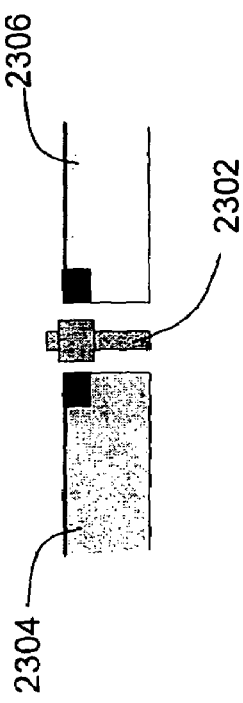
FIG. 23B is a schematic cross-sectional partial side view of the two microchips and intermediate electrical connector of FIG. 23A.

In one embodiment of the present invention, an intermediate connector or interposer with contacts made from a malleable material may provide a conductive but non-direct contact between non-protruding interconnect nodules. FIGS. 23A, 23B, 23C, and 23D show an intermediate connector 2302 used to electrically connect two microchips 2304 and 2306. As shown in FIGS. 23A and 23B, microchip 2304 includes circuitry 2312 and interconnect nodules 2314 and microchip 2306 includes circuitry 2322 and interconnect nodules 2324. Intermediate connector 2302 includes contacts 2342. As shown in FIGS. 23C and 23D, when microchips 2304 and 2306 are pressed against intermediate connector 2302, interconnect nodules 2314 and 2324 deform and make electrical contact with contacts 2342.

Although the embodiment shown in FIGS. 23A-D shows an interposer with deformable contacts, an interposer with non-deformable contacts may also be used to electrically connect the interconnect nodules of two or more microchips. Such a connector may include alignment means of the type described above with respect to two microchips directly with each other and/or various types of engagement means, similar to the dovetail tab and notch combinations described previously, that interact with engagement means on the edge of the microchips to keep the interconnect nodules of the microchips in electrical communication with the interposer.

To form the protruding interconnect nodules of the present invention, it is possible to utilize a process by which an additional conductive metal, such as copper, gold, etc. is deposited on the interconnect nodules of a microchip. Such a process may include the conventional stages of microchip production along with pressing out of the metal surface, preliminary dicing using a grinding plate, diamond cutter, deep etching or other known method to create deep grooves in the wafer surface. Deposition of the conductive metal may be made using any applicable method. The microchips may then be separated into separate microchips. FIGS. 24A, 24B, 24C, 24D, 24E, 24F, 24G, and 24H show one such process.

Figure 24C:
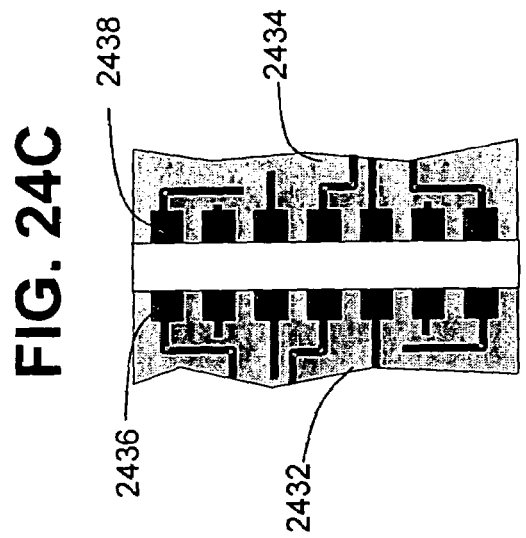
FIG. 24C is a schematic partial top view of the semiconductor wafer of FIG. 24A being mechanically etched by a rotating microsaw to form two partially-separated microchips.
Figure 24D:
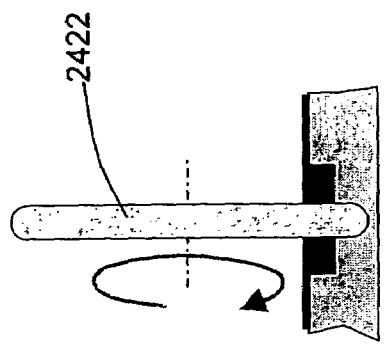
FIG. 24D is a schematic cross-sectional partial side view of the semiconductor wafer of FIG. 24A being mechanically etched by a rotating microsaw to form two partially-separated microchips.
Figure 24A:
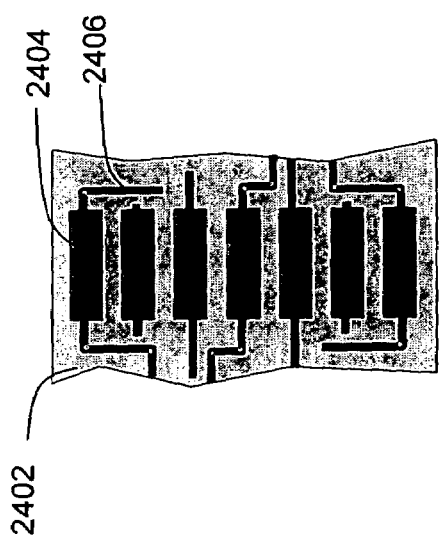
FIG. 24A is a schematic partial top view of the semiconductor wafer having a conductive material deposited in the trenches thereof and a circuitry deposited thereon in accordance with one embodiment of the present invention.
Figure 24B:
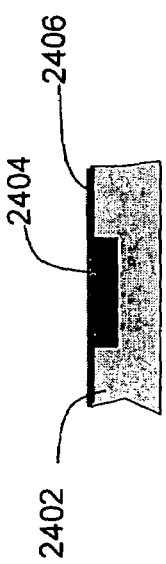
FIG. 24B is a schematic cross-sectional partial side view of the semiconductor wafer of FIG. 24A.
Figure 24G:
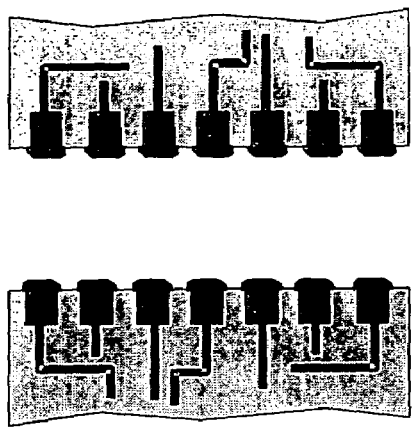
FIG. 24G is a schematic partial top view of the two microchips of FIGS. 24E and 24F after they have been fully separated by chemical or mechanical etching.
Figure 24H:
FIG. 24H is a schematic cross-sectional partial side view of the two microchips of FIGS. 24E and 24F after they have been fully separated by chemical or mechanical etching.
Figure 24E:
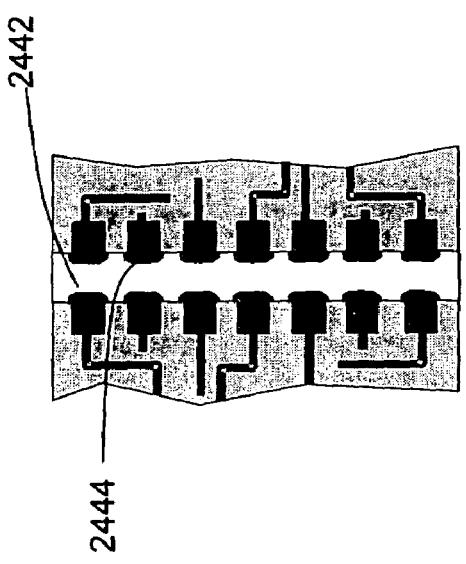
FIG. 24E is a schematic partial top view of additional conductive material being deposited on the interconnect nodules of the two microchips of FIGS. 24C and 24D to make the interconnect nodules protrude.
Figure 24F:
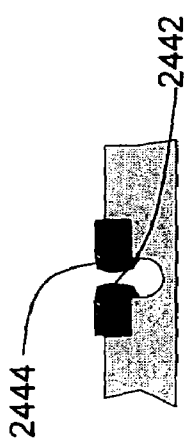
FIG. 24F is a schematic cross-sectional partial side view of additional conductive material being deposited on the interconnect nodules of the two microchips of FIGS. 24C and 24D to make the interconnect nodules protrude.

FIGS. 24A and 24B show a semiconductor wafer 2402 having trenches (not visible) in which has been deposited a conductive material 2404. Circuitry 2406 has also been deposited on semiconductor wafer 2402. FIGS. 24C and 24D show the use of a rotating microsaw 2422 to partially separate semiconductor wafer 2402 into two microchips 2432 and 2434 having respective non-protruding interconnect nodules 2436 and 2438 respectively. FIGS. 24E and 24F show additional conductive material 2442 and 2444 deposited on interconnect nodules 2436 and 2438 to make interconnect nodules 2436 and 2438 protrude. FIGS. 24G and 24H show the results of chemical or mechanical etching to fully separate microchips 2432 and 2434 from each other.

In one embodiment, the quilt packaging system of the present invention may be used to provide electrical connections between microchips of the present inventions and PCBs. Utilizing edge contacts instead of, or in addition to conventional contacts may increase connection speed, reliability, etc.

Figure 25A:
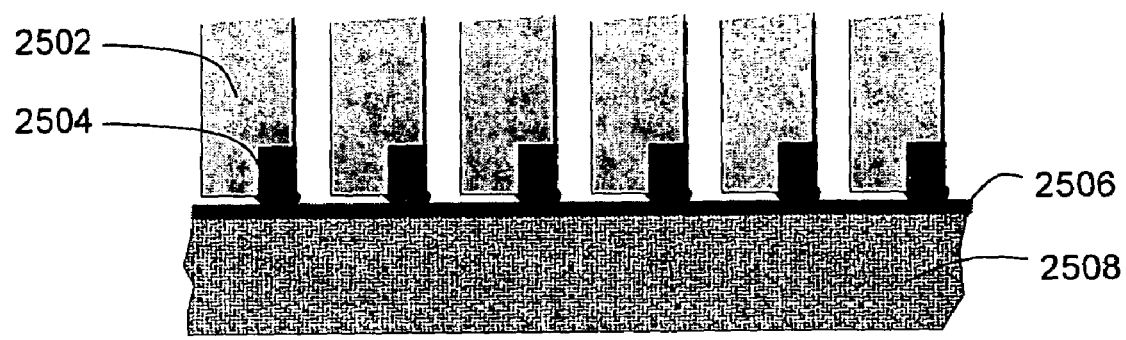
FIG. 25A is a schematic cross-sectional partial side view of microchips that are electrically connected to a PCB in accordance with one embodiment of the present invention.
Figure 25B:
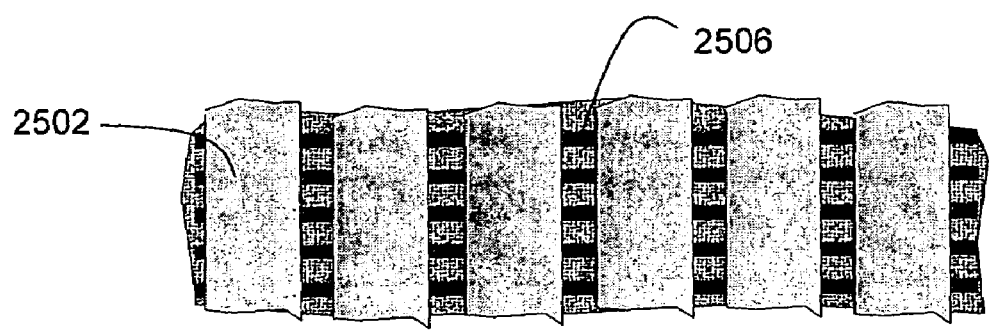
FIG. 25B is a schematic partial top view of the microchips and PCB of FIG. 25A.

FIGS. 25A and 25B shows one way of implementing an embodiment in which microchips are electrically connected to a PCB. In FIGS. 25A and 25B, a series of microchips 2502 are electrically connected by interconnect nodules 2504 to electrically conductive contact bars 2506 mounted on a PCB 2508.

When the microchips are mounted on a PCB the interconnect nodules of FIGS. 25A and 25B may be held in contact with the contact bars in several ways. For example, the PCB may include notches between the contact bars that engage tabs of the interconnect nodules. Other ways of holding the microchips in place on the PCB include ultrasonic welding, laser welding, thermomechanical bonding, solder, etc.

Figure 26A:
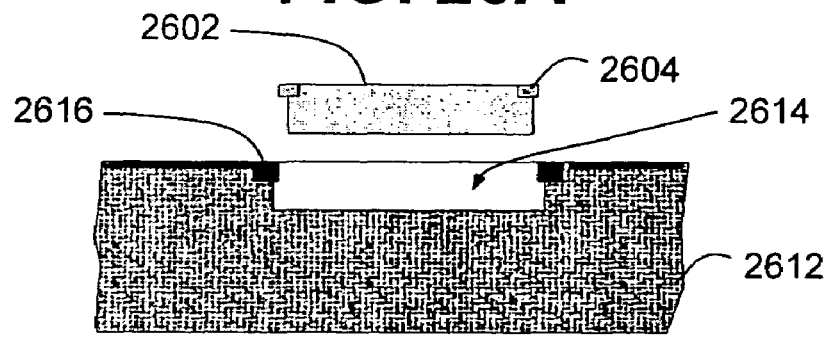
FIG. 26A is a schematic cross-sectional partial side view of a microchip in the process of being placed in a special outlet in a PCB in accordance with one embodiment of the present invention.
Figure 26B:
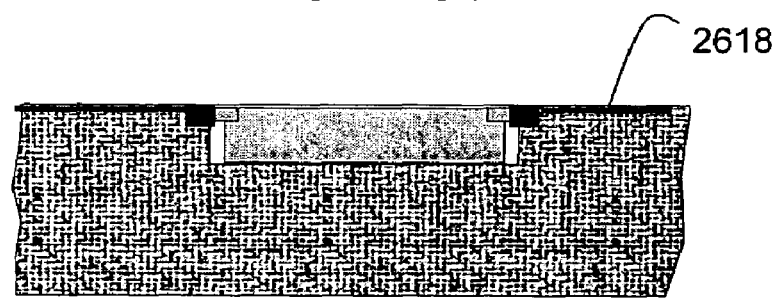
FIG. 26B is a schematic cross-sectional partial side view of the microchip of FIG. 26A mounted in the PCB of FIG. 26A.
Figure 26C:
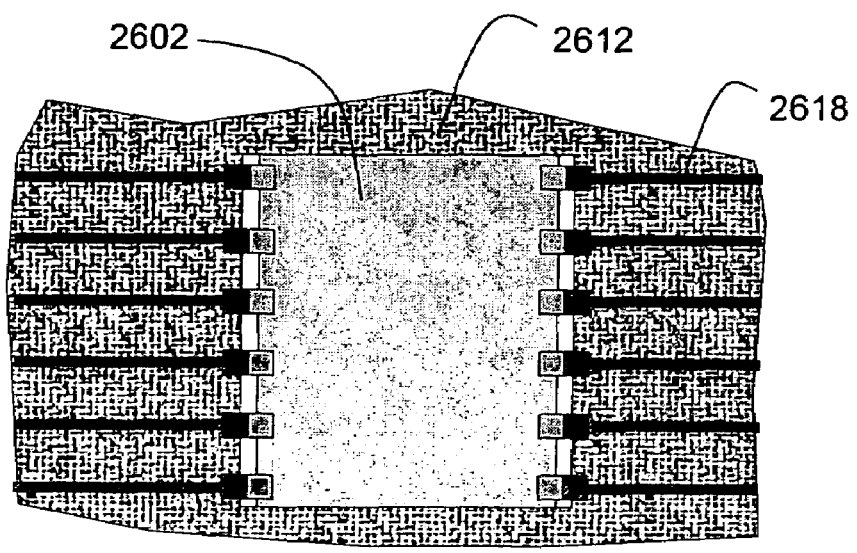
FIG. 26C is a schematic partial top view of the microchip and PCB of FIG. 26B.

In another embodiment of the present invention, microchips may be electrically connected to a PCB by installing each microchip in a special outlet created on the PCB that is equipped with appropriate contact areas. An example of such a configuration is shown in FIGS. 26A, 26B and 26C. FIG. 26A shows a microchip 2602 having interconnect nodules 2604 and a PCB 2612 having a recessed outlet 2614 including contacts 2616 that are electrically connected to contact bars 2618. Contact bars 2618 may be used to mount additional microchips (not shown) as shown in FIGS. 26A and 26B.

In one embodiment of the present invention, it is possible to create interconnect nodules in the production of conventional microchips connected to a PCB with wirebonds. In this case, the interconnect nodules may serve as outlets for testing or for additional functions, such as entering security codes that should not be entered through conventional contacts such as wirebonds.

To better ensure convenient contact between microchips and PCBs, in one embodiment of the present invention it is possible to utilize conventional microchips with wirebonds to which microchips of the present invention may be connected as shown in FIGS. 27A, 27B, 28A and 28B.

FIGS. 27A and 27B show a quilt packaging system 2702 of the present invention including four square microchips 2704 and a rectangular microchip 2706 that are connected together by interconnect nodules (not shown). Quilt packaging system 2702 is electrically connected to contact bars 2712 of a PCB 2714 by wirebonds 2716 extending from rectangular microchip 2706. FIGS. 28A and 28B show a quilt packaging system 2802 of the present invention including four peripheral hexagonal microchips 2804 and a central hexagonal microchip 2806 that are connected together by interconnect nodules (not shown). Quilt packaging system 2802 is electrically connected to contact bars 2812 of a PCB 2814 by wirebonds 2816 extending from central hexagonal microchip 2806.

Although only a few shapes of microchips are shown being interconnected in the quilt packaging systems of FIGS. 27A, 27B, 28A and 28B, various combinations of microchip shapes may be used in a quilt packaging system that is wirebonded to a PCB. For example, an octagonal microchip that is wire bonded to a PCB may be connected by interconnect nodules to square chips and/or rectangular microchips and/or hexagonal microchips.

To enhance the electrical connection between interconnect nodules of the present invention it is possible to create spheroid-shaped end interconnect nodules that are deformed by the connection process. For example, FIGS. 29A and 29B show two microchips 2902 and 2904 having spheroid-shaped end interconnect nodules 2912 and spheroid-shaped end interconnect nodules 2914, respectively, connected to circuitry 2916 and 2918, respectively. FIGS. 29C and 29D show microchips 2902 and 2904 pushed against each other to deform interconnect nodules 2912 and interconnect nodules 2914 as interconnect nodules 2912 and interconnect nodules 2914 are driven into each other, indicated by arrows 2932 and 2934 and as ultrasonic welding is applied, indicated by sinusoids 2936 and 2938, to bond together interconnect nodules 2912 and 2914.

Although the welding technique shown in FIGS. 29C and 29D is ultrasonic welding, other types of welding such as heat welding, laser welding, or any other type of welding used to join two pieces of metals may be used to bond together the interconnect nodules of the present invention.

Figure 30A:
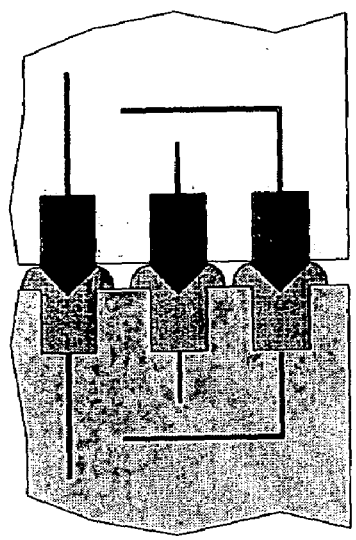
FIG. 30A is a schematic partial top view of two microchips of the present invention wherein the interconnect nodules on one microchip have a blunt shape and the interconnect nodules on the other microchip having a sharp shape.
Figure 30C:
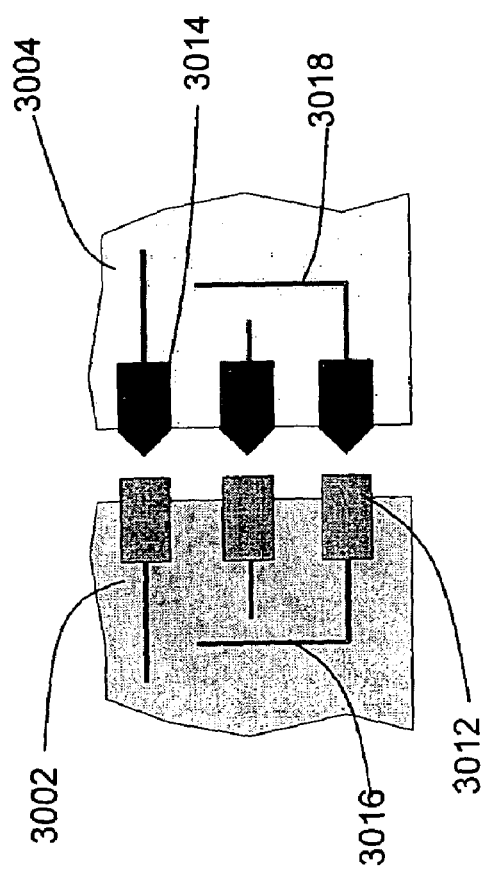
FIG. 30C is a schematic partial top view of the two microchips of FIG. 30A being bonded together.
Figure 30B:
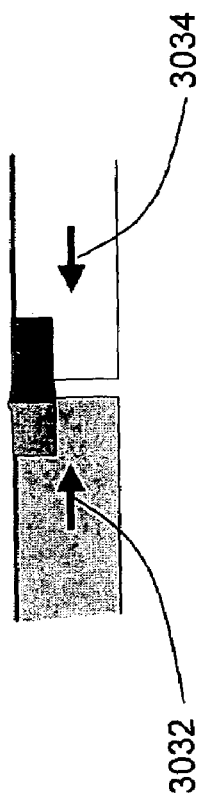
FIG. 30B is a schematic partial cross-sectional side view of the two microchips of FIG. 30A.
Figure 30D:
FIG. 30D is a schematic partial cross-sectional side view of the two microchips of FIG. 30C.

It is also possible to create interconnect nodules on the microchips of the present invention from materials having different hardness and deformation characteristics. For example, the contacts may be made from different metals or from different alloys of the same metal having different hardnesses. Such interconnect nodules may be used in an intrusion bonding process such as that shown in FIGS. 30A, 30B, 30C, and 30D. In an intrusion bonding process, the interconnect nodules made of the harder material each have a sharp end while the softer interconnect nodules each has a blunt end. During the bonding process, the sharp end presses into the softer one to create a good contact. For example, FIGS. 30A and 30B show two microchips 3002 and 3004 having blunt end interconnect nodules 3012 and sharp end interconnect nodules 3014, respectively, connected to circuitry 3016 and 3018, respectively. FIGS. 30C and 30D show microchips 3002 and 3004 pushed against each other, indicated by arrows 3032 and 3034, to deform blunt interconnect nodules 3012 as interconnect nodules 3014 pushes into interconnect nodule 3012.

After the sharp end interconnect nodules are pushed into the blunt interconnect nodules, each set of blunt end and sharp end interconnect nodules may be welded together using a welding technique such as ultrasonic welding, heat welding, laser welding, etc. to bond the blunt end and sharp end interconnect nodules together. Also, it may be possible to employ a procedure similar to that described above using blunt end and sharp end interconnect nodules having the same hardness.

Although the microchips in FIGS. 30A-30D are shown with interconnect nodules all having the same shape, not all of the interconnect nodules on a given microchip or a given edge of a microchip need have the same shape. For example, the interconnect nodules may alternate between blunt and sharp interconnect nodules on a given edge or half the edges of a microchip may having sharp interconnect nodules and the other half of the edges may have blunt interconnect nodules.

In addition, it may be possible to pre-shape interconnect nodules having a approximately the same hardness so that one set of interconnect nodules will mate with the other set of interconnect nodules when the interconnect nodules are brought together. For example, one set of interconnect nodules may be made to have a male shape while other interconnect nodules may have a female shape, such as shown in FIGS. 37A, 37B, 37C, 37D, described below. Also, not all of the interconnect nodules on a given microchip or a given edge of a microchip need have the same shape. For example, the interconnect nodules may alternate between male and female shaped interconnect nodules on a given edge or half the edges of a microchip may having male interconnect nodules and the other half of the edges may have female interconnect nodules. Also, the interconnect nodules may have other male and female pre-formed shapes than the shapes shown in FIGS. 37C and 37D.

Figure 31A:
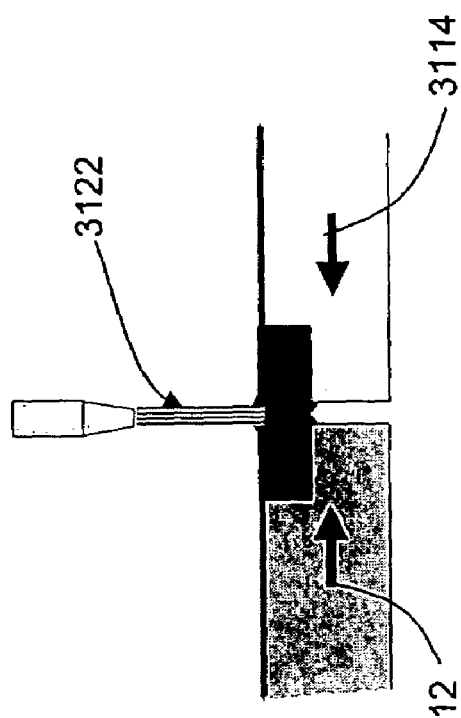
FIG. 31A is a schematic partial cross-sectional side view of the two microchips in accordance with one embodiment of the present invention.
Figure 31B:
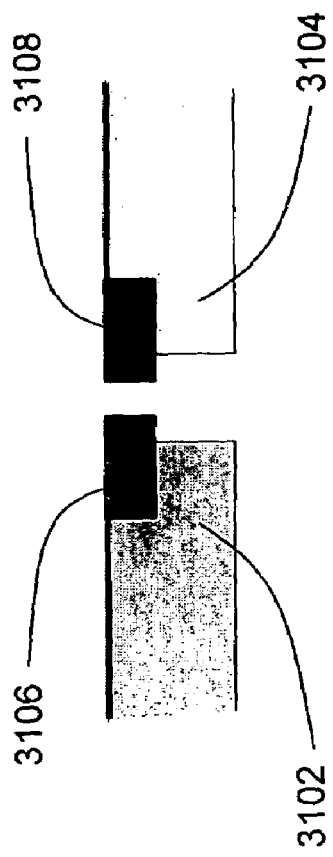
FIG. 31B is a schematic partial cross-sectional side view of the microchips of FIG. 31A being bonded together using a laser beam.

An example of bonding interconnect nodules of the present invention using a laser beam is shown in FIGS. 31A and 31B. Microchips 3102 and 3104 include interconnect nodules 3106 and 3108, respectively. As microchips 3102 and 3104 are moved towards each other, as indicated by arrows 3112 and 3114, a laser beam 3122 bonds interconnect nodules 3106 and 3108 to each other.

Figure 32:
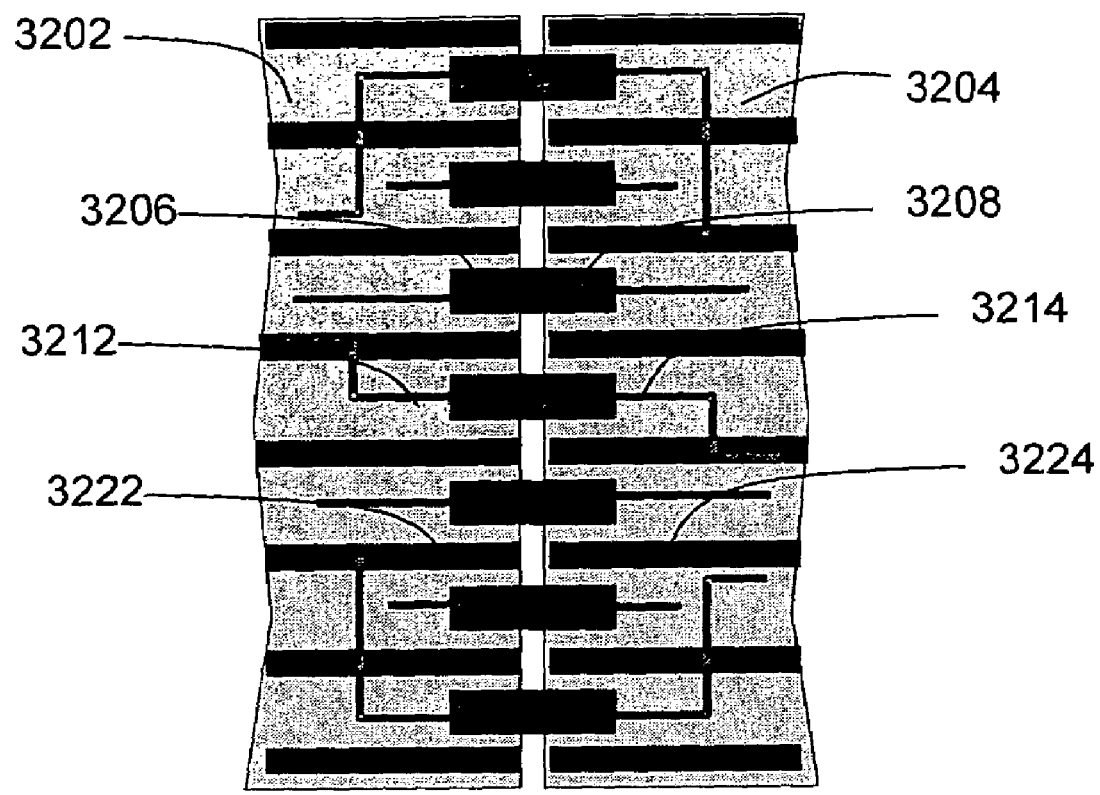
FIG. 32 is a schematic partial top view of two microchips of the present invention bonded together.

Ground connections may be included in the microchips of the present invention to serve as electromagnetic shields. For example, FIG. 32 shows two microchips 3202 and 3204 having respective interconnect nodules 3206 and 3208 connected to circuits 3212 and 3214, respectively. Each set of interconnect nodules 3206 and 3208 are bonded to each other. Microchips 3202 and 3204 also include ground connections 3222 and 3224.

The high electrical performance afforded by direct-conductive edge interconnects allows the use of high speed serial data transfers between chips. Serializing the data allows data to be transferred using a smaller number of interconnects. In one embodiment of the present invention the USB-2 protocol may be used for the interconnect nodules that electrically connect the microchips of a quilt packaging system of the present invention with each other or with another electronic device.

Figure 33A:
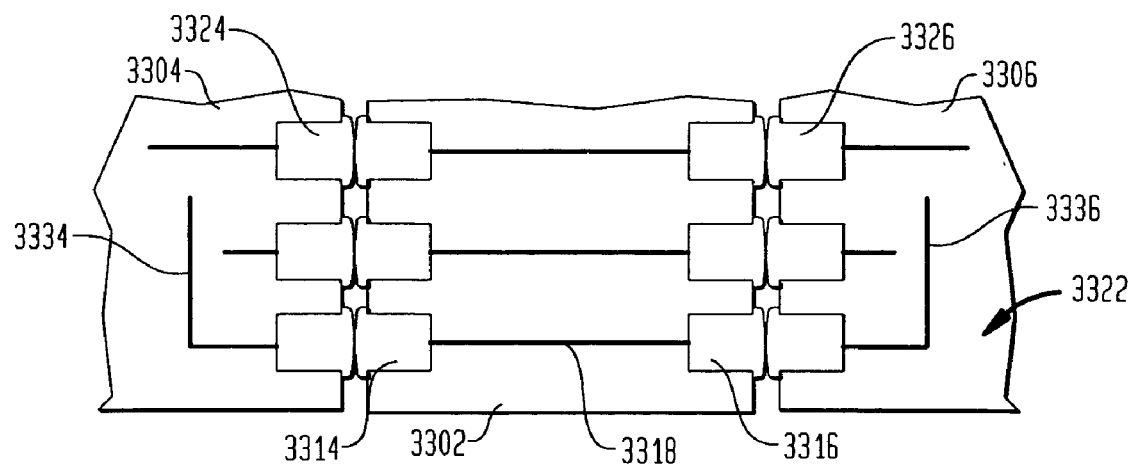
FIG. 33A is a schematic partial top view of two microchips connected by a rigid connector in accordance with one embodiment of the present invention.
Figure 33B:
FIG. 33B is a schematic partial cross-sectional side view of the two microchips and the connector of FIG. 33A.

If for some reason it is impossible or impractical to connect the microchips directly along their edges, special connectors may be utilized such rigid connectors to fix the microchip and/or flexible connectors that allow for adjustments in distance. FIGS. 33A and 33B show the use of a rigid connector 3302 that electrically connects microchips 3304 and 3306 to each other. Connector 3302 includes sets of contacts 3314 and 3316 that are connected to each other by wires 3318. Contacts 3314 make direct electrical contact with interconnect nodules 3324 of microchip 3304 and contacts 3316 make direct electrical contact with interconnect nodules 3326 of microchip 3306. Interconnect nodules 3324 are connected to circuitry 3334 and interconnect nodules 3326 are connected to circuitry 3336.

Figure 34A:
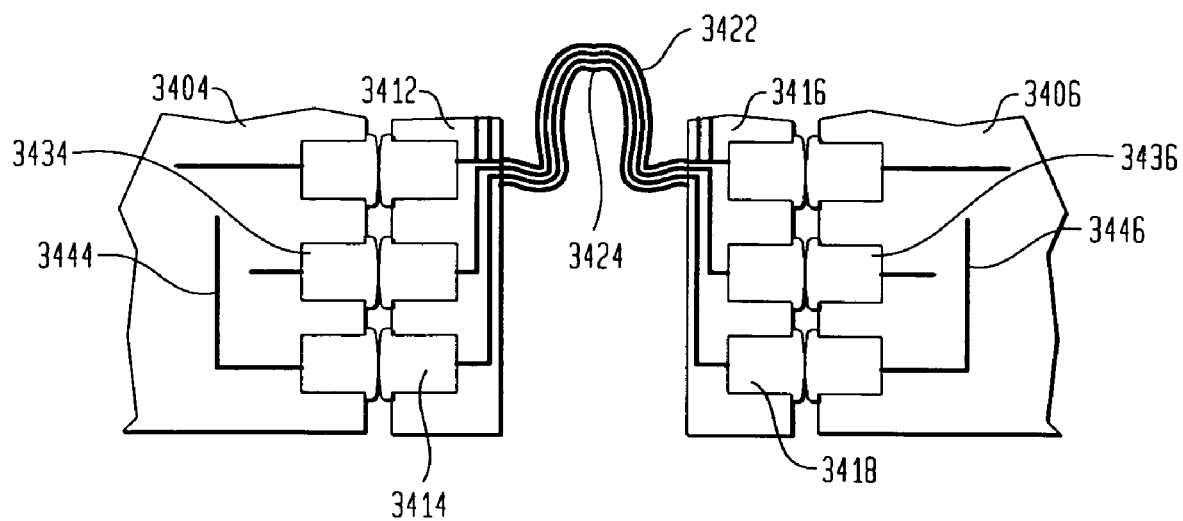
FIG. 34A is a schematic partial top view of two microchips connected by a flexible connector in accordance with one embodiment of the present invention.
Figure 34B:
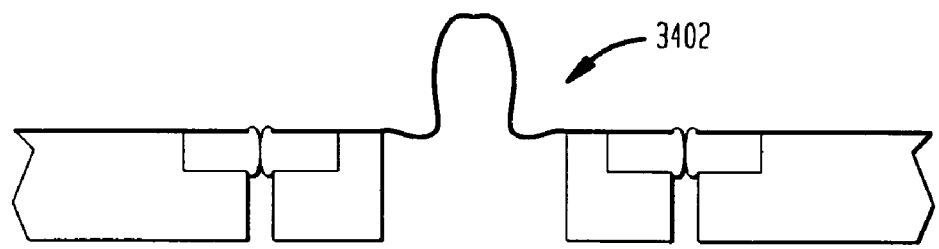
FIG. 34B is a schematic partial cross-sectional side view of the two microchips and the connector of FIG. 34A.

FIGS. 34A and 34B show the use of two-section flexible connector 3402 that electrically connects microchips 3404 and 3406 to each other. Connector 3402 includes a section 3412 having contacts 3414 and a section 3416 having contacts 3418. Sections 3412 and 3416 are connected to each other by a connecting cord 3422. Inside connecting cord 3422 are wires 3424 that connect sets of contacts 3414 and 3418 to each other. Contacts 3414 make direct electrical contact with interconnect nodules 3434 of microchip 3404 and contacts 3418 make direct electrical contact with interconnect nodules 3436 of microchip 3406. Interconnect nodules 3434 are connected to circuitry 3444 and interconnect nodules 3436 are connected to circuitry 3446.

The microchips of the present invention also allow for increasing dynamism of contacts. In addition to the static type of electrical contact between chips described in the embodiments above, the microchips of the present invention may be dynamically connected to provide on-off contacts. This provides a new degree of freedom in terms of chip functionality. In one embodiment, the quilt packaging system of the present invention may be used to form a dynamic on-off type of system by moving microchips in various directions. Such dynamic on-off type systems may have applications where it is desirable to turn on and off the functions performed by a quilt packaging system.

FIGS. 35A and 35B shows a dynamic sliding on-off quilt packaging system in accordance with one embodiment of the present invention. FIG. 35A shows two microchips 3502 and 3504 of the present invention in an off-position 3506 and FIG. 35B shows microchips 3502 and 3504 in an on position 3508. Microchip 3502 has an integral alignment tab 3512 and an alignment notch 3514 on an edge 3516 of microchip 3502. Microchip 3504 has an integral alignment notch 3522 and an alignment tab 3524 on an edge 3526 of microchip 3504. As shown in FIG. 35B, alignment tab 3512 fits into alignment notch 3522 and alignment tab 3524 fits into alignment notch 3514 to align respective interconnect nodules 3532 and 3534 of microchips 3502 and 3504 when interconnect nodules 3532 and 3534 are slid into contact with each other, as indicated by arrows 3542 and 3544, in on-position 3508 FIG. 35B. Microchips 3502 and 3504 slide between on position 3506 and 3508 along rails 3552 and 3554.

FIGS. 36A and 36B shows a dynamic flexible on-off quilt packaging system in accordance with one embodiment of the present invention. FIG. 36A shows two microchips 3602 and 3604 of the present invention in an off-position 3606 and FIG. 36B shows microchips 3602 and 3604 in an on position 3608. A flexible but non-stretchable membrane 3612 connects microchips 3602 and 3604 to each other. When microchips 3602 are in off-position 3606, membrane 3612 is bent and interconnect nodules 3622 and 3624 of microchips 3602 and 3604, respectively, are not electrically connected to each other. When microchips 3602 are placed in on-position 3608, as indicated by arrows 3632 and 3634, membrane 3612 is flat and interconnect nodules 3622 and 3624 are electrically connected.

The interconnect nodules of the present invention in addition to being involved in electrical connection may also be capable of emitting electromagnetic fields to function as part of an antenna, a dipole, a capacitor, etc.

EXAMPLES

Example 1

3D electromagnetic simulations of interconnects on Si substrates using a simulated quilt packaging system of the present invention were conducted. The simulated quilt packaging systems provided: 1. Signal bandwidths >150 GHz 2. Low return loss/controllable impedance (~20 dB return loss to 150 GHz predicted from simulations) 3. Very small excess delay (<75 fs) relative to on-chip interconnects. All of these performance metrics were achieved with simple, unoptimized structures.

Example 2

A procedure, similar to that described above with respect to FIGS. 2A-H was performed to form microchips of the present invention, with the exception that no additional metal interconnect layers were fabricated. A semiconductor wafer was formed in a conventional fashion to include die-on-wafer. Trenches were etched alongside edges of each microchip. Trenches for the edges of some microchips were shaped to produce male interconnect nodules and the trenches for the edges of other microchips were shaped to produce female interconnect nodules. Next, the exposed surfaces of the trenches were passivated by forming an oxide layer on the exposed surfaces of trenches by using a known semiconductor oxidation technique. Then a metal seed layer was evaporated on the whole wafer. Then a resist coating was applied. After the resist coating was applied, the resist coating was removed from everywhere but the trenches to protect the trenches. Then the metal seed layer was removed everywhere except where protected. Next the resist was removed. An electroless plating solution was then applied over the deposited seed metal to form metal interconnect nodules. Then metal interconnect nodules were subject to chemical mechanical polishing (CMP). Then interconnect nodules and non-conducting spacing regions were separated from each other using DRIE. Final separation of the microchips from each other could be completed by backside wafer thinning, as suggested in FIG. 2I.

Figure 37A:
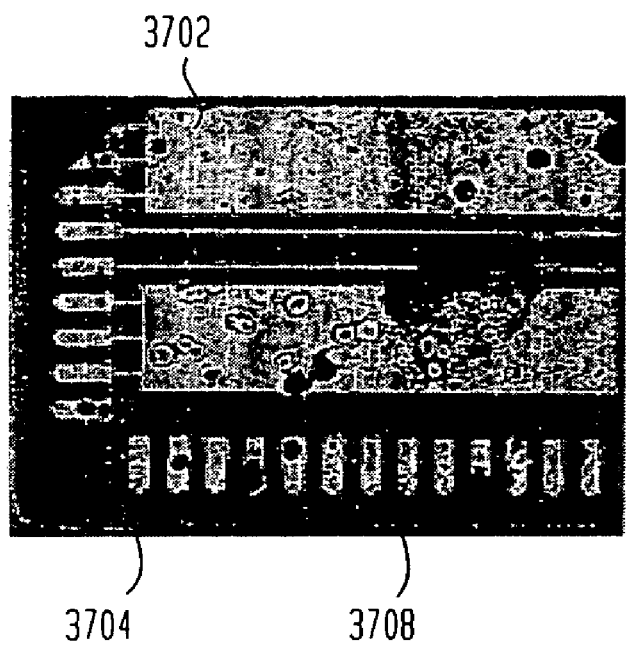
FIG. 37A is a micrograph of part of a microchip in accordance with one embodiment of the present invention.
Figure 37B:
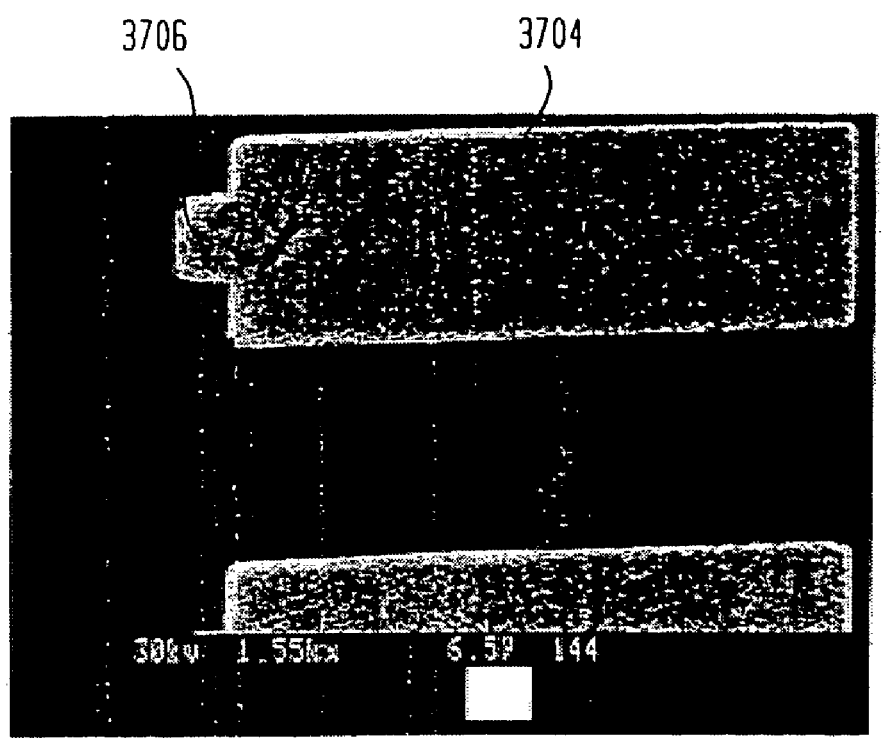
FIG. 37B is micrograph at greater magnification than the micrograph of FIG. 37A showing an interconnect nodule of the microchip of FIG. 37A.
Figure 37C:
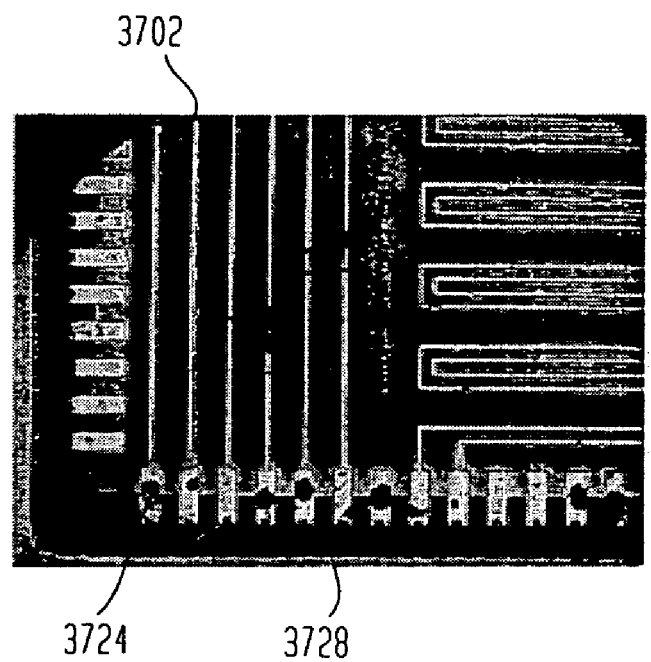
FIG. 37C is a micrograph of part of a microchip in accordance with one embodiment of the present invention.
Figure 37D:
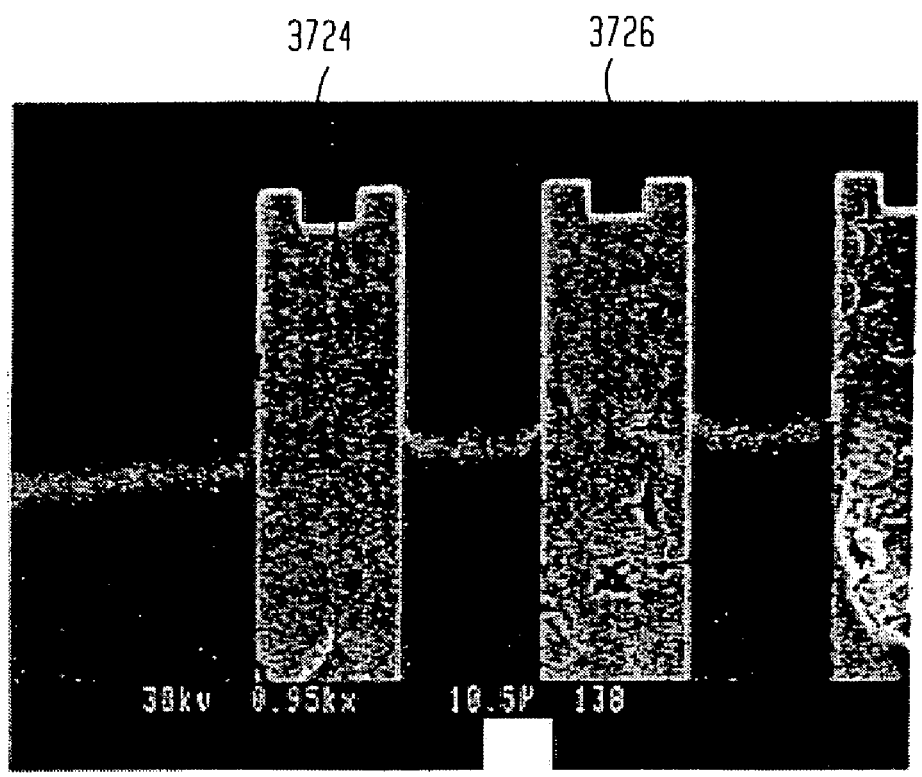
FIG. 37D is micrograph at greater magnification than the micrograph of FIG. 37C showing an interconnect nodule of the microchip of FIG. 37C.

FIGS. 37A and 37B are micrographs that show a resulting microchip 3702 including protruding interconnect nodules 3704 having male ends 3706. Interconnect nodules 3704 are disposed on edges 3708 of microchip 3702. FIG. 37A shows a plurality of nodules on two edges 3708 and FIG. 37B shows two full nodules 3704. FIGS. 37C and 37D show a resulting microchip 3722 including protruding interconnect nodules 3724 having female ends 3726 that are complementary with male ends 3706. Interconnect nodules 3724 are disposed on edges 3728 of microchip 3702. FIG. 37C shows a plurality of nodules on two edges 3728 and FIG. 37B shows two full nodules 3724. Although particular male and female ends are formed in this example, interconnect nodules of the present invention may have various male and female shapes that are complementary.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A microchip packaging system comprising:
    a first microchip having a convex shape comprising three or more edge surfaces, a plurality of said edge surfaces having one or more interconnect modules disposed thereon; and
    at least a second microchip having a convex shape comprising three or more edge surfaces, a plurality of said edge surfaces having one or more interconnect nodules disposed thereon,
    wherein a first edge surface of said second microchip is positioned contiguous to a first edge surface of said first microchip, and wherein at least one of said one or more interconnect nodules disposed on said first edge surface of said first microchip is configured to be in physical contact with at least one of said one or more interconnect nodules disposed on said first edge surface of second microchip so as to provide a direct electrical connection between said at least one edge surfaces of said first and second microchips.

2. The system of claim 1, wherein said at least one interconnect nodule disposed on said first edge surfaces of said first and second microchips each protrude from said first edge surfaces.

3. The system of claim 1, wherein at least one of said one or more interconnect nodules of said first microchip is deformable.

4. The system of claim 1, wherein said first microchip is positioned in a first plane, and wherein said second microchip is positioned in said first plane adjacent to said first microchip.

5. The system of claim 1, wherein said first microchip is positioned in a first plane, and wherein said second microchip is positioned in a second plane.

6. The system of claim 1, further comprising:
    at least a third microchip having one or more interconnect nodules disposed on an edge surface thereof, and wherein at least one of said one or more interconnect nodules of said third microchip is configured to be directly electrically connected to at least one of said one or more interconnect nodules of said first microchip.

7. The system of claim 1, wherein said first microchip and said second microchip each have different convex shapes.

8. The system of claim 1, wherein said first and second electrically interconnected microchips collectively comprise a single chip device.

9. The system of claim 1, further comprising:
a female alignment element disposed on said first edge surface of said first microchip; and
a male alignment element, disposed on said first edge surface of said second microchip, configured to be inserted into said female alignment element to align said at least one interconnect module disposed on said first edge surface of said first microchip with said at least one interconnect nodule disposed on said first edge surface of said second microchip.

10. The system of claim 9, wherein said at least one interconnect nodule disposed on said first edge surface of said first microchip is positioned in said female alignment element, and wherein said at least one interconnect nodule disposed on said first edge surface of said second microchip is positioned on said male alignment element, and wherein said microchips are electrically connected when said male alignment element is inserted into said female alignment element.

11. The system of claim 9, wherein said female alignment element comprises an alignment notch, and wherein said male alignment element comprises an alignment tab.

12. The system of claim 11, wherein said alignment notch has a concave trapezoidal shape, and wherein said alignment tab has a convex trapezoidal shape.

13. The system of claim 11, wherein said alignment notch has a concave rectangular shape, and wherein said alignment tab has a convex rectangular shape.

14. A quilt packaging system comprising:
a first electronic device having a convex shape comprising three or more edge surfaces, a plurality of said edge surfaces having one or more interconnect modules disposed thereon; and
at least a second electronic device having a convex shape comprising three or more edge surfaces, a plurality of said edge surfaces having one or more interconnect nodules disposed thereon,
wherein a first edge surface of said second electronic device is positioned contiguous to a first edge surface of said first electronic device, and wherein at least one of said one or more interconnect nodules disposed on said first edge surface of said first electronic device is configured to be in physical contact with at least one of said one or more interconnect nodules disposed on said first edge surface of second electronic device so as to provide a direct electrical connection between said at least one edge surfaces of said first and second electronic devices.

15. The system of claim 14, wherein said at least one interconnect nodule disposed on said first edge surfaces of said first and second electronic devices each protrude from said first edge surfaces.

16. The system of claim 14, wherein at least one of said one or more interconnect nodules of said first electronic device is deformable.

17. The system of claim 14, wherein said first electronic device is positioned in a first plane, and wherein said second electronic device is positioned in said first plane adjacent to said first electronic device.

18. The system of claim 14, wherein said first electronic device is positioned in a first plane, and wherein said second electronic device is positioned in a second plane.

19. The system of claim 14, further comprising:
at least a third electronic device having one or more interconnect nodules disposed on an edge surface thereof, and wherein at least one of said one or more interconnect nodules of said third electronic device is configured to be directly electrically connected to at least one of said one or more interconnect nodules of said first electronic device.

20. The system of claim 14, wherein said first electronic device and said second electronic device each have different convex shapes.

21. The system of claim 14, further comprising:
a female alignment element disposed on said first edge surface of said first electronic device; and
a male alignment element, disposed on said first edge surface of said second electronic device, configured to be inserted into said female alignment element to align said at least one interconnect module disposed on said first edge surface of said first electronic device with said at least one interconnect nodule disposed on said first edge surface of said second electronic device.

22. The system of claim 21, wherein said at least one interconnect nodule disposed on said first edge surface of said first electronic device is positioned in said female alignment element, and wherein said at least one interconnect nodule disposed on said first edge surface of said second electronic device is positioned on said male alignment element, and wherein said electronic devices are electrically connected when said male alignment element is inserted into said female alignment element.

23. The system of claim 21, wherein said female alignment element comprises an alignment notch, and wherein said male alignment element comprises an alignment tab.

24. The system of claim 23, wherein said alignment notch has a concave trapezoidal shape, and wherein said alignment tab has a convex trapezoidal shape.

25. The system of claim 23, wherein said alignment notch has a concave rectangular shape, and wherein said alignment tab has a convex rectangular shape.

* * * * *